(12) United States Patent
Maehashi et al.

(10) Patent No.: US 9,438,206 B2
(45) Date of Patent: Sep. 6, 2016

(54) STORAGE CIRCUIT AND SEMICONDUCTOR DEVICE

(71) Applicant: Semiconductor Energy Laboratory Co., Ltd., Kanagawa-ken (JP)

(72) Inventors: Yukio Maehashi, Kanagawa (JP); Seiichi Yoneda, Kanagawa (JP); Wataru Uesugi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/471,322

(22) Filed: Aug. 28, 2014

(65) Prior Publication Data

US 2015/0061742 A1 Mar. 5, 2015

(30) Foreign Application Priority Data

Aug. 30, 2013 (JP) ................................. 2013-180168

(51) Int. Cl.
*H03K 3/356* (2006.01)
*H03K 3/012* (2006.01)

(52) U.S. Cl.
CPC ............. *H03K 3/012* (2013.01); *H03K 3/356* (2013.01); *H03K 3/356104* (2013.01)

(58) Field of Classification Search
None
See application file for complete search history.

(56) References Cited

U.S. PATENT DOCUMENTS

| | | |
|---|---|---|
| 5,007,022 A | 4/1991 | Leigh |
| 5,250,852 A * | 10/1993 | Ovens ............... H03K 3/012 326/95 |
| 5,406,134 A | 4/1995 | Menut |
| 5,731,856 A | 3/1998 | Kim et al. |
| 5,744,864 A | 4/1998 | Cillessen et al. |
| 5,784,384 A | 7/1998 | Maeno |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,762,637 B2 | 7/2004 | Raychaudhuri |

(Continued)

FOREIGN PATENT DOCUMENTS

| | | |
|---|---|---|
| CN | 001159680 A | 9/1997 |
| CN | 001431778 A | 7/2003 |

(Continued)

OTHER PUBLICATIONS

International Search Report re Application No. PCT/JP2014/072665, dated Dec. 2, 2014.

(Continued)

*Primary Examiner* — Long Nguyen
(74) *Attorney, Agent, or Firm* — Husch Blackwell LLP

(57) ABSTRACT

The storage circuit includes first and second logic circuits, first and second transistors whose channel formation regions include an oxide semiconductor, and a capacitor. The first and second transistors are connected to each other in series, and the capacitor is connected to a connection node of the first and second transistors. The first transistor functions as a switch that controls connection between an output terminal of the first logic circuit and the capacitor. The second transistor functions as a switch that controls connection between the capacitor and an input terminal of the second logic circuit. Clock signals whose phases are inverted from each other are input to gates of the first and second transistors. Since the storage circuit has a small number of transistors and a small number of transistors controlled by the clock signals, the storage circuit is a low-power circuit.

11 Claims, 10 Drawing Sheets

(56) References Cited

U.S. PATENT DOCUMENTS

| | | | |
|---|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,808,286 B1 | 10/2010 | Miller et al. |
| 8,410,838 B2 | 4/2013 | Kato et al. |
| 8,860,485 B2 | 10/2014 | Kato et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0187166 A1* | 8/2006 | Azami ............... G09G 3/3688 345/95 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0271078 A1 | 10/2010 | Miller et al. |
| 2011/0121878 A1 | 5/2011 | Kato et al. |
| 2011/0148497 A1* | 6/2011 | Ishii ............... H03K 19/0013 327/210 |
| 2013/0141157 A1* | 6/2013 | Takemura ............ G11C 19/184 327/534 |
| 2013/0222033 A1 | 8/2013 | Kato et al. |
| 2014/0266367 A1 | 9/2014 | Uesugi |

FOREIGN PATENT DOCUMENTS

| | | |
|---|---|---|
| CN | 102668077 A | 9/2012 |
| DE | 69301062 T2 | 6/1996 |
| DE | 19636083 A1 | 3/1997 |
| DE | 19654928 C2 | 2/2001 |
| DE | 19654929 C2 | 8/2002 |
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-228296 A | 10/1991 |
| JP | 05-251705 A | 9/1993 |
| JP | 06-140882 A | 5/1994 |
| JP | 08-264794 A | 10/1996 |
| JP | 09-270677 A | 10/1997 |
| JP | 11-505377 | 5/1999 |
| JP | 2000-022503 A | 1/2000 |
| JP | 2000022503 A * | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-129896 A | 6/2011 |
| JP | 2013-021700 A | 1/2013 |
| JP | 2013-141212 | 7/2013 |
| KR | 10-0199272 B1 | 6/1999 |
| KR | 2012-0096514 A | 8/2012 |
| TW | 201140592 | 11/2011 |
| WO | WO 2004/114391 A1 | 12/2004 |
| WO | WO 2011/062075 A1 | 5/2011 |

OTHER PUBLICATIONS

Written opinion re Application No. PCT/JP2014/072665, dated Dec. 2, 2014.

Fortunato, E. et al., "Wide-Bandgap High-Mobility ZnO Thin-Film Transistors Produced at Room Temperature," Applied Physics Letter, Sep. 27, 2004, vol. 85, No. 13, pp. 2541-2543.

(56) References Cited

OTHER PUBLICATIONS

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Nomura, K. et al., "Room-Temperature Fabrication of Transparent Flexible Thin-Film Transistors Using Amorphous Oxide Semiconductors," NATURE, Nov. 25, 2004, vol. 432, pp. 488-492.

Park, J. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins, M. et al., "A Ferroelectric Transparent Thin-Film Transistor," Applied Physics Letters, Jun. 17, 1996, vol. 68, No. 25, pp. 3650-3652.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Nomura, K. et al., "Thin-Film Transistor Fabricated in Single-Crystalline Transparent Oxide Semiconductor," SCIENCE, May 23, 2003, vol. 300, No. 5623, pp. 1269-1272.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Osada, T. et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Son, K. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Lee, J. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Nowatari, H. et al., "60.2: Intermediate Connector With Suppressed Voltage Loss For White Tandem OLEDs," SID Digest '09: SID International Symposium Digest of Technical Papers, May 31, 2009, vol. 40, pp. 899-902.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Tsuda, K. et al., "Ultra Low Power Consumption Technologies for Mobile TFT-LCDs," IDW '02: Proceedings of the 9th International Display Workshops, Dec. 4, 2002, pp. 295-298.

Van de Walle, C. "Hydrogen as a Cause of Doping in Zinc Oxide," Physical Review Letters, Jul. 31, 2000, vol. 85, No. 5, pp. 1012-1015.

Fung, T. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong, J. et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park, J. et al., "High Performance Amorphous Oxide Thin Film Transistors with Self-Aligned Top-Gate Sturcture," IEDM 09: Technical Digest of International Electron Devices Meeting, Dec. 7, 2009, pp. 191-194.

Kurokawa, Y. et al., "UHF RFCPUS on Flexible and Glass Substrates for Secure RFID Systems," Journal of Solid-State Circuits, 2008, vol. 43, No. 1, pp. 292-299.

Ohara, H. et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates, D. et al., "Optical Studies of the Amorphous Liquid-Cholesteric Liquid Crystal Transition:The 'Blue Phase'," Physics Letters, Sep. 10, 1973, vol. 45A, No. 2, pp. 115-116.

Cho, D. et al., "21.2:Al and Sn-Doped Zinc Indium Oxide Thin Film Transistors for AMOLED Back-Plane," SID Digest '09: SID International Symposium Digest of Technical Papers, May 31, 2009, pp. 280-283.

Lee, M. et al., "15.4:Excellent Performance of Indium—Oxide-Based Thin-Film Transistors by DC Sputtering," SID Digest '09: SID International Symposium Digest of Technical Papers, May 31, 2009, pp. 191-193.

Jin, D. et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata, J. et al., "Development of 4.0-In. AMOLED Display With Driver Circuit Using Amorphous In—Ga—Zn—Oxide TFTs," IDW '09: Proceedings of the 16th International Display Workshops, 2009, pp. 689-692.

Park, J. et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S. et al., "Challenge to Future Displays: Transparent AM-OLED Driven by Peald Grown ZnO TFT," IMID '07 Digest, 2007, pp. 1249-1252.

Godo, H. et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada, T. et al., "Development of Driver-Integrated Panel Using Amorphous In—Ga—Zn—Oxide TFT," AM-FPD '09 Digest of Technical Papers, Jul. 1, 2009, pp. 33-36.

Hirao, T. et al., "Novel Top-Gate Zinc Oxide Thin-Film Transistors (ZnO TFTs) for AMLCDS," Journal of the SID, 2007, vol. 15, No. 1, pp. 17-22.

Hosono, H., "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo, H. et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara, H. et al., "21.3:4.0 In. QVGA AMOLED Display Using In—Ga—Zn—Oxide TFTs With a Novel Passivation Layer," SID Digest '09: SID International Symposium Digest of Technical Papers, May 31, 2009, pp. 284-287.

(56) References Cited

OTHER PUBLICATIONS

Miyasaka, M. "Suftla Flexible Microelectronics on Their Way to Business," SID Digest '07: SID International Symposium Digest of Technical Papers, 2007, vol. 38, pp. 1673-1676.

Chern, H. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi, H. et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Lee, H. et al., "Current Status of, Challenges to, and Perspective View of AM-OLED," IDW '06: Proceedings of the 13th International Display Workshops, Dec. 7, 2006, pp. 663-666.

Kikuchi, H. et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, M. "Synthesis of Homologous Compound with New Long-Period Structure," NIRIM Newsletter, Mar. 1, 1995, vol. 150, pp. 1-4.

Kikuchi, H. et al., "Polymer-Stabilized Liquid Crystal Blue Phases," NATURE Materials, Sep. 2, 2002, vol. 1, pp. 64-68.

Kimizuka, N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn]at Temperatures over 1000° C.," Journal of Solid State Chimistry, 1985, vol. 60, pp. 382-384.

Kitzerow, H. et al., "Observation of Blue Phases in Chiral Networks," Liquid Crystals, 1993, vol. 14, No. 3, pp. 911-916.

Costello, M. et al., "Electron Microscopy of a Cholesteric Liquid Crystal and Its Blue Phase," Physical Review. A, May 1, 1984, vol. 29, No. 5, pp. 2957-2959.

Meiboom, S. et al., "Theory of the Blue Phase of Cholesteric Liquid Crystals," Physical Review Letters, May 4, 1981, vol. 46, No. 18, pp. 1216-1219.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita, M. et al., "Mechanism of Electrical Conductivity of Transparent InGaZnO4," Physical Review. B, Jan. 15, 2000, vol. 61, No. 3, pp. 1811-1816.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Janotti, A. et al., "Native Point Defects in ZnO," Physical Review. B, Oct. 4, 2007, vol. 76, No. 16, pp. 165202-1-165202-22.

Park, J. et al., "Electronic Transport Properties of Amorphous Indium—Gallium—Zinc Oxide Semiconductor Upon Exposure to Water," Applied Physics Letters, 2008, vol. 92, pp. 072104-1-072104-3.

Hsieh, H. et al., "P-29: Modeling of Amorphous Oxide Semiconductor Thin Film Transistors and Sugap Density of States," SID Digest '08: SID International Symposium Digest of Technical Papers, 2008, vol. 39, pp. 1277-1280.

Janotti, A. et al., "Oxygen Vacancies in ZnO," Applied Physics Letters, 2005, vol. 87, pp. 122102-1-122102-3.

Oba, F. et al., "Defect Energetics in ZnO: A Hybrid Hartree-Fock Density Functional Study," Physical Review. B, 2008, vol. 77, pp. 245202-1-245202-6.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Mo, Y. et al., "Amorphous Oxide TFT Backplanes for Large Size AMOLED Displays," IDW '08: Proceedings of the 6th International Display Workshops, Dec. 3, 2008, pp. 581-584.

Kim, S. et al., "High-Performance Oxide Thin Film Transistors Passivated by Various Gas Plasmas," 214th ECS Meeting, 2008, No. 2317, ECS.

Clark, S. et al., "First Principles Methods Using Castep," Zeitschrift fur Kristallographie, 2005, vol. 220, pp. 567-570.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Park, J. et al., "Dry Etching of ZnO films and Plasma-Induced Damage to Optical Properties," Journal of Vacuum Science & Technology B, Mar. 1, 2003, vol. 21, No. 2, pp. 800-803.

Oh, M. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

\* cited by examiner

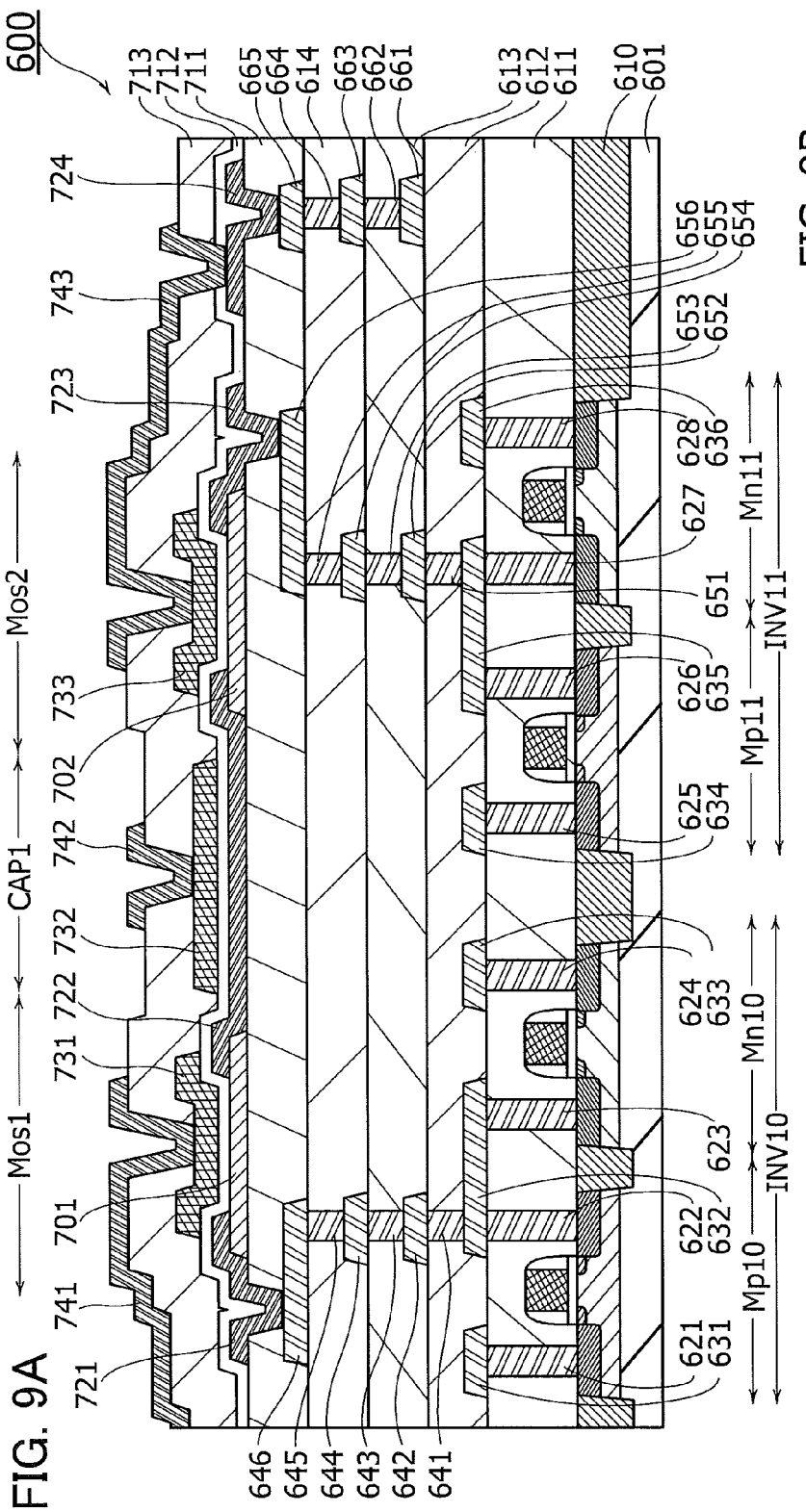
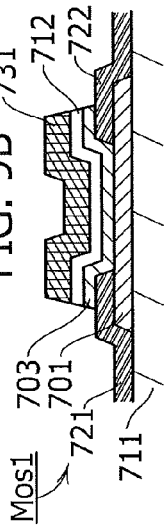
FIG. 9A
FIG. 9B

STORAGE CIRCUIT AND SEMICONDUCTOR DEVICE

TECHNICAL FIELD

The present invention relates to an object, a method, or a manufacturing method. In addition, the present invention relates to a process, a machine, manufacture, or a composition of matter. In particular, one embodiment of the present invention relates to a semiconductor device, a method for driving the semiconductor device, and a method for manufacturing the semiconductor device. Specifically, one embodiment of the present invention relates to a flip-flop circuit and a semiconductor device including the flip-flop circuit.

Note that in this specification, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are all semiconductor devices. Moreover, a display device, a light-emitting device, a lighting device, an electronic device, and the like include a semiconductor device in some cases.

BACKGROUND ART

A flip-flop (hereinafter abbreviated as FF) is a kind of sequential logic circuit, which is a storage circuit that stores 1-bit data as "0" or "1." A master-slave FF is known as an FF in which two latch circuits each including an inverter loop are connected to each other in series.

FIG. 11A illustrates a conventional master-slave FF. FIG. 11B is an equivalent circuit diagram of FIG. 11A. As illustrated in FIGS. 11A and 11B, a flip-flop circuit (FF) 1 includes two latch circuits (LAT-1 and LAT-2) connected to each other in series. LAT-1 includes an inverter (INV) 2 and clocked inverters (CINV) 3 and 4. LAT-2 includes INV 5, CINV 6, and CINV 7. The phases of clock signals CLK and CLKB are inverted from each other. VDD is high power supply voltage, and VSS is low power supply voltage.

In FF 1, when the clock signal CLK is high (H), input data D is retrieved from an input terminal and LAT-1 outputs the data to LAT-2. When the clock signal CLK is low (L), LAT-1 separates the input terminal from an internal circuit and retains the retrieved data. LAT-2 retrieves the data retained in LAT-1 and outputs the data as data Q from an output terminal.

A transistor whose channel formation region includes an oxide semiconductor (OS) such as an In—Ga—Zn oxide (In—Ga—Zn—O) (hereinafter such a transistor is referred to as an OS transistor) is known. It is known that an OS transistor has extremely low off-state current because an oxide semiconductor has a wider bandgap than silicon. For example, Patent Document 1 discloses a flip-flop circuit in which an OS transistor is used as a switch.

REFERENCE

Patent Document: Japanese Published Patent Application No. 2013-141212

DISCLOSURE OF INVENTION

The power consumption of a semiconductor device such as a processor needs to be reduced. Owing to scaling and improved integration technology, a large integrated circuit or a microprocessor includes hundreds of millions of transistors. The power consumption of such a semiconductor device is increased because many transistors operate and leakage current (specifically, gate leakage current) of the transistors is increased due to scaling. Consequently, a chip generates heat, which inhibits an increase in operating frequency.

To solve such a problem, for example, power supply voltage is lowered. When the power supply voltage is lowered, the threshold voltages of transistors need to be lowered. When the threshold voltage is lowered, off-state leakage current of the transistors is increased, so that static power consumption is increased. Thus, the power supply voltage cannot be lowered unlimitedly.

In addition, to reduce the power consumption of a semiconductor device, circuits that do not need to operate are stopped by power gating, clock gating, or the like. When FF 1 in FIG. 11A is simply powered off, stored data is lost. Thus, when power supply is restarted to operate the FF, output data of the FF is undefined. This might cause malfunction of a combinational circuit connected to an output of the FF.

The FF is one of storage circuits included in a semiconductor device. An object of one embodiment of the present invention is to provide a low-power storage circuit. An object of one embodiment of the present invention is to provide a novel storage circuit. An object of one embodiment of the present invention is to provide a novel storage circuit including an OS transistor. An object of one embodiment of the present invention is to provide a storage circuit that can retain data even in a standby state or a power-off state. An object of one embodiment of the present invention is to provide a storage circuit whose data retention characteristics in a standby state or a power-off state are improved.

An object of one embodiment of the present invention is to provide a low-power semiconductor device. An object of one embodiment of the present invention is to provide a novel semiconductor device. An object of one embodiment of the present invention is to provide a novel semiconductor device including an OS transistor.

Note that the description of the plurality of objects does not disturb the existence of another object or another purpose. One embodiment of the present invention does not necessarily achieve all the objects. Other objects will be apparent from and can be derived from the description of the specification, the drawings, the claims, and the like.

One embodiment of the present invention is a storage circuit that includes first and second logic circuits, first and second transistors, a first capacitor, and first and second nodes. The first capacitor is connected to the first node. An input terminal of the second logic circuit is connected to the second node. The first transistor functions as a switch that controls connection between an output terminal of the first logic circuit and the first node. A first clock signal is input to a gate of the first transistor. The second transistor functions as a switch that controls connection between the first and second nodes. A second clock signal is input to a gate of the second transistor. The phases of the first clock signal and the second clock signal are inverted from each other. A channel formation region of each of the first and second transistors includes an oxide semiconductor.

One embodiment of the present invention is a storage circuit that includes first and second logic circuits, first and second inverters, first and second transistors, a first capacitor, and first to third nodes. The first capacitor is connected to the first node. Third and fourth transistors are connected to each other in series between the second and third nodes. An input terminal of the second logic circuit is connected to the third node. The first transistor functions as a switch that controls connection between an output terminal of the first logic circuit and the first node. A first clock signal is input to a gate of the first transistor. The second transistor functions as a switch that controls connection between the first and second nodes. A second clock signal is input to a gate of the second transistor. The phases of the first clock signal and the second clock signal are inverted from each other. A channel formation region of each of the first and second transistors includes an oxide semiconductor. Alternatively, one embodiment of the present invention is a storage circuit that includes first and second logic circuits, first and second transistors, a first capacitor, and first and second nodes. The first capacitor is connected to the first node. An input terminal of the second logic circuit is connected to the second node. The first transistor functions as a switch that controls connection between an output terminal of the first logic circuit and the first node. A first clock signal is input to a gate of the first transistor. The second transistor functions as a switch that controls connection between the first and second nodes. A second clock signal is input to a gate of the second transistor. The phases of the first clock signal and the second clock signal are inverted from each other. A channel formation region of each of the first and second transistors includes an oxide semiconductor.

One embodiment of the present invention is a semiconductor device including the storage circuit according to any of the above embodiment of the present invention.

According to one embodiment of the present invention, it is possible to provide a low-power storage circuit. According to one embodiment of the present invention, it is possible to provide a storage circuit that can retain data even in a standby state or a power-off state. According to one embodiment of the present invention, it is possible to provide a low-power semiconductor device.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF DRAWINGS

In the accompanying drawings:

FIG. 9A is a cross-sectional view illustrating a structure example of a semiconductor device (die) including an FF, and FIG. 9B is a cross-sectional view illustrating a structure example of an OS transistor;

BEST MODE FOR CARRYING OUT THE INVENTION

Figure 1A:
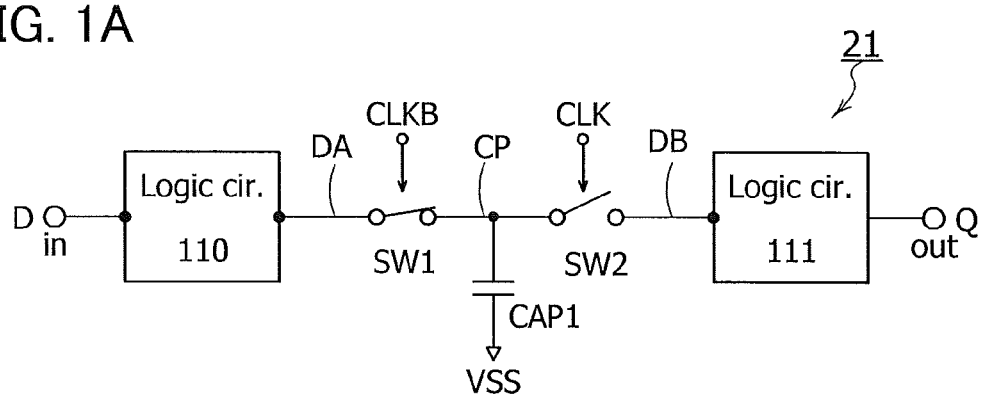
FIGS. 1A to 1C are block diagrams each illustrating a structure example of a flip-flop circuit (FF)

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

In the drawings used for the description of embodiments of the present invention, the same portions or portions having similar functions are denoted by the same reference numerals, and description thereof is not repeated in some cases.

Embodiment 1

In this embodiment, flip-flop circuits (FF) are described as examples of a storage circuit that stores 1-bit data.

FIG. 1A is a block diagram illustrating structure example of the FF. FF 21 includes a logic circuit 110, a logic circuit 111, a switch SW 1, a switch SW 2, and a capacitor CAP 1.

In the following description, the switch SW 1 might be abbreviated to SW 1. The same applies to signals, voltages, circuits, elements, and wirings.

The capacitor CAP 1 is connected to a connection node (node CP) of SW 1 and SW 2 and functions as a storage capacitor for retaining output data of the logic circuit 110.

An output terminal (node DA) of the logic circuit 110 is connected to an input terminal (node DB) of the logic circuit 111 by SW 1 and SW 2 connected to each other in series. The on and off states of SW 1 and SW 2 are controlled by the clock signals CLKB and CLK, respectively. The phases of CLKB and CLK are inverted from each other. While FF 21 performs normal operation, SW 1 and SW 2 are alternately turned on or off.

In FF 21, the voltage of the node CP is rewritten in response to the clock signals CLK and CLKB in accordance with the voltage of an input data signal D. This means that the internal state of FF 21 is updated. In addition, the data signal D input from an input terminal in is sequentially transferred to the nodes DA, CP, and DB and is output from an output terminal out as a data signal Q.

Figure 1B:
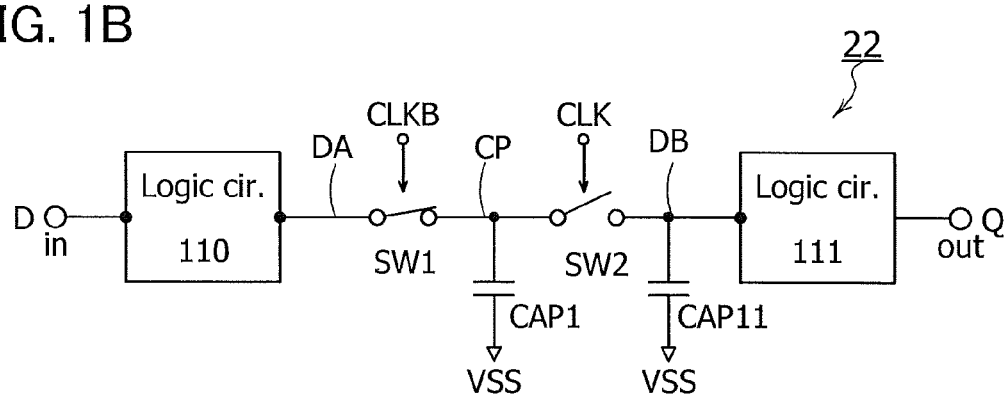

In addition, in FF 21, a capacitor may be intentionally connected to the node DB. FIG. 1B illustrates a structure example of such an FF. When SW 2 is off, electric charge of the node DB leaks. Thus, as in FF 22, a capacitor CAP 11 may be intentionally connected to the node DB to hold the voltage of the node DB in CAP 11 when SW 2 is off. Consequently, variations in the voltage of the node DB can be reduced when SW 2 is off. The capacitance of CAP 11 is preferably lower than or equal to one-tenth of the capacitance of CAP 1.

Figure 1C:
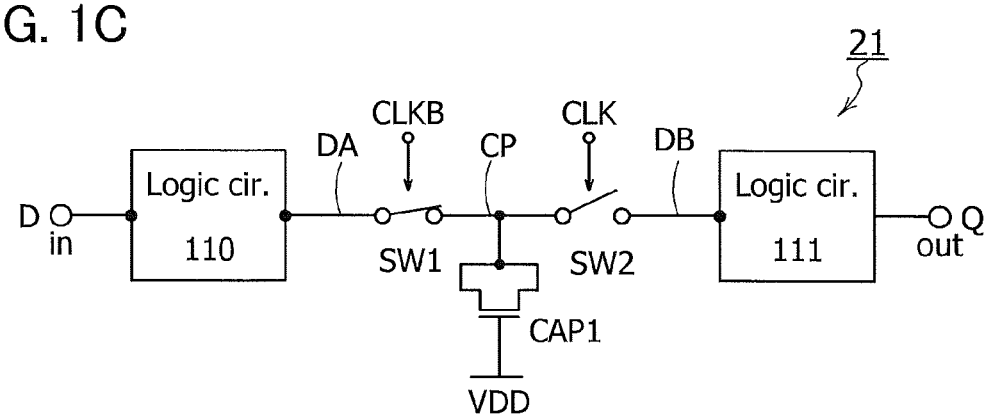

There is no particular limitation on the device structure of a capacitor intentionally provided as an element in the FF in this embodiment. For example, as illustrated in FIGS. 1A and 1B, a metal-insulator-metal (MIM) capacitor can be used. Alternatively, a metal-oxide-semiconductor (MOS) capacitor can be used. FIG. 1C illustrates a structure example of FF 21 including a MOS capacitor (CAP 1). In the case where a plurality of capacitors are intentionally provided in the FF in this embodiment, the device structures of the plurality of capacitors may be the same or different.

Here, VSS and VDD represent low power supply voltage and high power supply voltage, respectively. For example, VSS may be fixed voltage such as a ground potential GND. In addition, voltage supplied to the capacitor may be not fixed voltage such as VDD or VSS but voltage that varies depending on FF operation.

Note that in the case where a MOS capacitor is used, high voltage is preferably supplied to a gate of a transistor used as a capacitor when the transistor is an n-channel transistor, and low voltage is preferably supplied to the gate of the transistor when the transistor is a p-channel transistor. Thus, in FIG. 1C, VDD is supplied to the gate. Alternatively, the position of the transistor may be changed so that the gate is connected to the node CP. In that case, VSS or the like is preferably supplied to a source or a drain.

In the case where a MOS capacitor is used, a semiconductor layer used for SW 1 or SW 2 may be used as a semiconductor layer. In other words, the semiconductor layer used for SW 1, the semiconductor layer used for SW 2, and the semiconductor layer used for the MOS capacitor may be deposited, etched, and patterned at the same time. In addition, the semiconductor layer used for SW 1, the semiconductor layer used for SW 2, and the semiconductor layer used for the MOS capacitor may be formed as one island-shaped semiconductor region. The semiconductor layer used for the MOS capacitor may have n-type conductivity so that the transistor operates as the capacitor easily.

SW 1 and SW 2 are each formed using a transistor whose off-state leakage current (off-state current) is extremely low, so that FF 21 and FF 22 can function as storage circuits. Some specific structure examples of the FF are described below with reference to drawings. It is needless to say that a plurality of structure examples in this embodiment can be combined as appropriate.

Structure Example 1

Figure 2A:
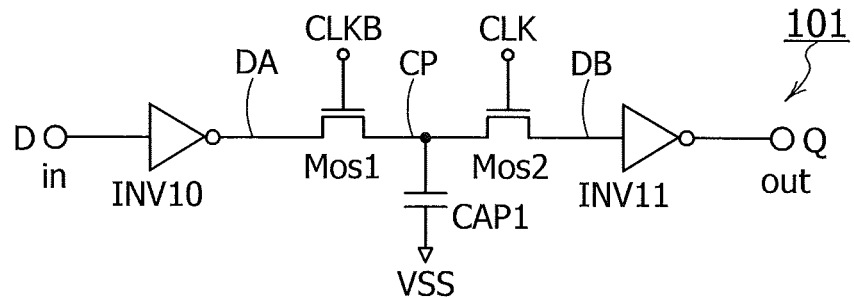
FIG. 2A is a circuit diagram illustrating a structure example of an FF.
Figure 2B:
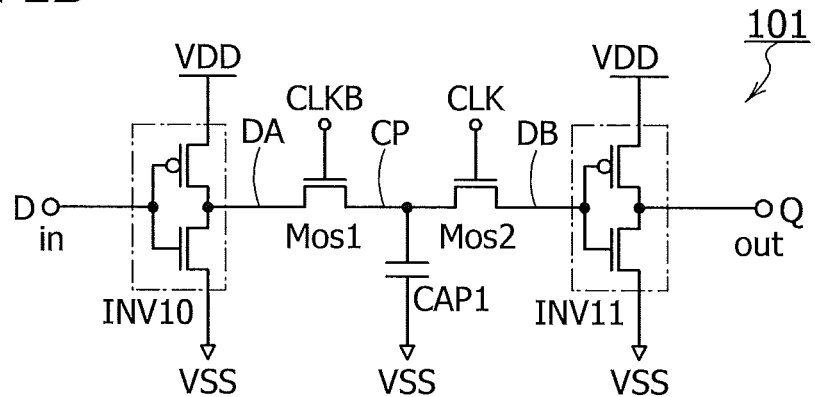
FIG. 2B is an equivalent circuit diagram of FIG. 2A.
Figure 2C:
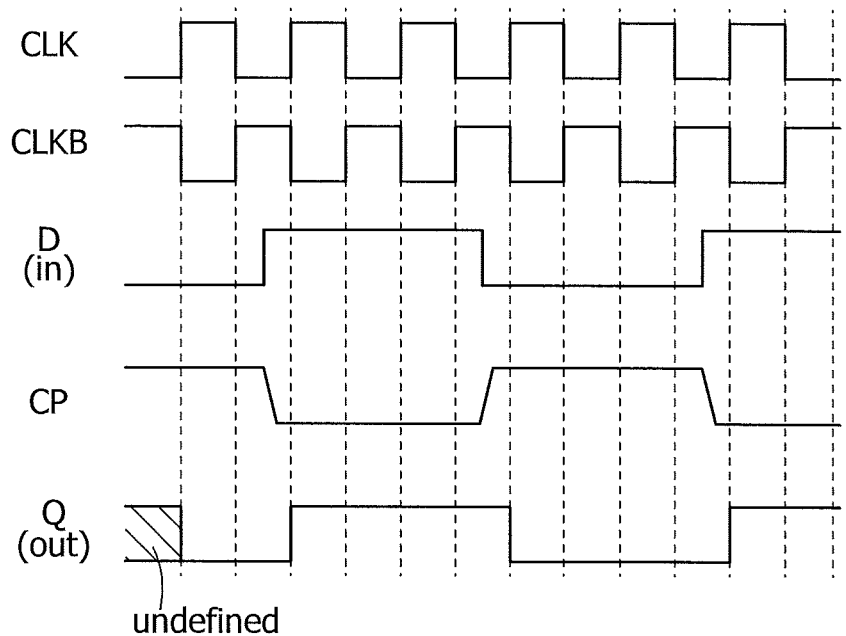
FIG. 2C is a timing chart illustrating an operation example of the FF.

FIG. 2A is a circuit diagram illustrating a structure example of an FF, and FIG. 2B is an equivalent circuit diagram of FIG. 2A. FIG. 2C is a timing chart illustrating an operation example of the FF.

FF 101 includes inverters INV 10 and INV 11, transistors Mos 1 and Mos 2, and a capacitor CAP 1. FF 101 corresponds to a storage circuit in which the two logic circuits 110 and 111 in FF 21 are formed using inverters.

In the following description, the inverter INV 10 might be abbreviated to INV 10. The same applies to signals, voltages, circuits, elements, and wirings.

Note that a transistor is an element having three terminals: a gate, a source, and a drain. Depending on the channel type of the transistor or levels of voltages applied to the terminals, one of two terminals (the source and the drain) functions as a source and the other of the two terminals functions as a drain. In general, in an n-channel transistor, a terminal to which low voltage is applied is called a source, and a terminal to which high voltage is applied is called a drain. In contrast, in a p-channel transistor, a terminal to which low voltage is applied is called a drain, and a terminal to which high voltage is applied is called a source. In the following description, to clarify circuit structure and circuit operation, one of two terminals of a transistor is fixed as a source and the other of the two terminals is fixed as a drain in some cases. It is needless to say that, depending on a driving method, the magnitude relationship between voltages applied to the terminals of the transistor might be changed, and the source and the drain might be interchanged.

INV 10, the transistor Mos 1, the transistor Mos 2, and INV 11 are connected to each other in series between an input terminal and an output terminal of FF 101. In FIG. 2A, the transistors Mos 1 and Mos 2 are n-channel transistors. INV 10 and INV 11 can be, for example, CMOS inverters (FIG. 2B). One terminal of the capacitor CAP 1 is connected to the node CP, and the other terminal of the capacitor CAP 1 is connected to a wiring to which VSS is supplied. Note that the other terminal may be connected to a wiring to which VDD is supplied.

The node CP is a connection node of Mos 1 and Mos 2. Mos 1 functions as a switch that connects an output terminal (node DA) of INV 10 to the node CP, and the clock signal CLKB is input to a gate of Mos 1. Mos 2 functions as a switch that connects the node CP to an input terminal (node DB) of INV 11, and the clock signal CLK is input to a gate of Mos 2. The clock signal CLKB is an inverted clock signal obtained by phase inversion of the clock signal CLK.

As illustrated in FIG. 2C, the internal state of FF 101 is updated when CLKB is raised. The data signal D input from the input terminal in is sequentially transferred to the nodes CP and DB in response to CLK and CLKB and is output from the output terminal out as the data signal Q.

At this time, the potentials of CLK and CLKB at a high level (H) are preferably higher than VDD. Thus, Mos 1 and Mos 2 can be turned on reliably. In other words, the potential level of the data signal Q is hardly affected by the threshold voltages of Mos 1 and Mos 2. Consequently, for example, when a high level (H) is input to the node CP through Mos 1, the potential of the node CP can be sufficiently increased. It is needless to say that one embodiment of the present invention is not limited thereto.

The gate capacitance of a transistor in INV 11 is preferably much lower than the capacitance of CAP 1. For example, the gate capacitance of the transistor in INV 11 is preferably much lower than the capacitance of CAP 1. The gate capacitance of the transistor in INV 11 is more preferably lower than half of the capacitance of CAP 1. It is needless to say that one embodiment of the present invention is not limited thereto.

Note that in FIG. 2A, one inverter is provided in each of a data path between the input terminal in and the node CP and a data path between the node CP and the output terminal out; however, a plurality of inverters connected to each other in series can be provided in each data path. In addition, as in FF 22, the capacitor CAP 11 may be connected to the node DB in FF 101.

(Transistor Application)

The node CP functions as a data storage portion of FF 101. CAP 1 functions as a storage capacitor for holding the voltage of the node CP.

Thus, as a method for reducing output errors of FF 101, variations in the voltage of the node CP are reduced as much as possible. The transistors Mos 1 and Mos 2 function as switches that are alternately turned on or off while FF 101 performs normal operation. Accordingly, to reduce variations in the voltage of the node CP, the transistors Mos 1 and Mos 2 preferably have extremely low off-state current. Extremely low off-state current means that off-state current per micrometer of channel width is lower than or equal to 100 zA. Since the off-state current is preferably as low as possible, normalized off-state current is preferably lower than or equal to 10 zA/μm or lower than or equal to 1 zA/μm, more preferably lower than or equal to 10 yA/μm.

An example of such a transistor having extremely low off-state current is an OS transistor. An oxide semiconductor used for a channel has a wider bandgap (3.0 eV or higher) than a Group 14 semiconductor such as Si or Ge; thus, an OS transistor has low leakage current due to thermal excitation and extremely low off-state current.

By reducing impurities serving as electron donors (donors), such as moisture or hydrogen, and reducing oxygen vacancies, an i-type (intrinsic) or substantially intrinsic oxide semiconductor can be obtained. Here, such an oxide semiconductor is referred to as a highly purified oxide semiconductor. By forming the channel using a highly purified oxide semiconductor, the off-state current of the OS transistor that is normalized by channel width can be as low as several yoctoamperes per micrometer to several zeptoamperes per micrometer.

The oxide semiconductor of the OS transistor preferably contains at least indium (In) or zinc (Zn). The oxide semiconductor preferably contains an element that functions as a stabilizer for reducing variations in electrical characteristics. Examples of such an element include Ga, Sn, Hf, Al, and Zr. Typical examples of the oxide semiconductor of the OS transistor include an In—Ga—Zn-based oxide and an In—Sn—Zn-based oxide. Note that the OS transistor is described in detail in Embodiment 2.

Thus, in FF 101, the transistors Mos 1 and Mos 2 may be OS transistors. There is no particular limitation on the transistors included in INV 10 and INV 11, and transistors included in the semiconductor device including FF 101 can be used as the transistors included in INV 10 and INV 11. For example, INV 10 and INV 11 can each include a transistor whose channel is formed using a semiconductor made of a Group 14 element, such as Si, SiC, or Ge (e.g., a Si transistor), or an OS transistor. The Si transistor has higher off-state current than the OS transistor but has higher response speed than the OS transistor, which is advantageous; thus, INV 10 and INV 11 preferably each include a Si transistor.

Figure 11A:
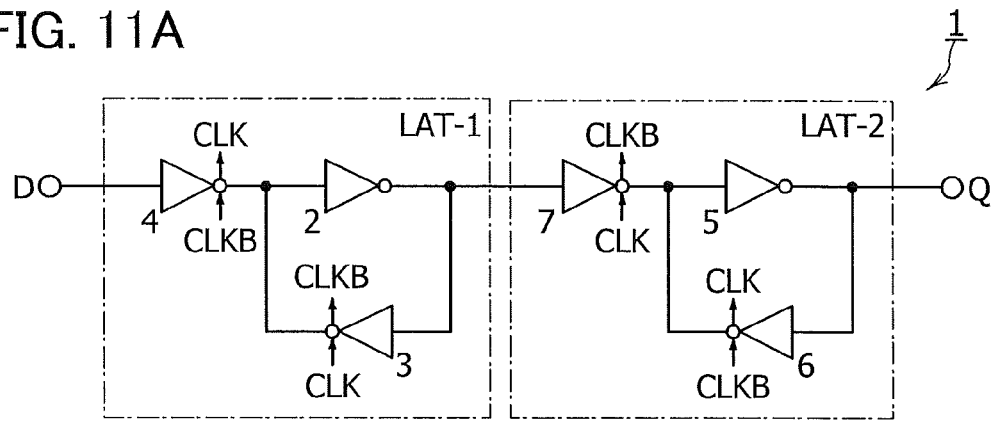
FIG. 11A is a circuit diagram illustrating a structure example of a conventional flip-flop circuit.
Figure 11B:
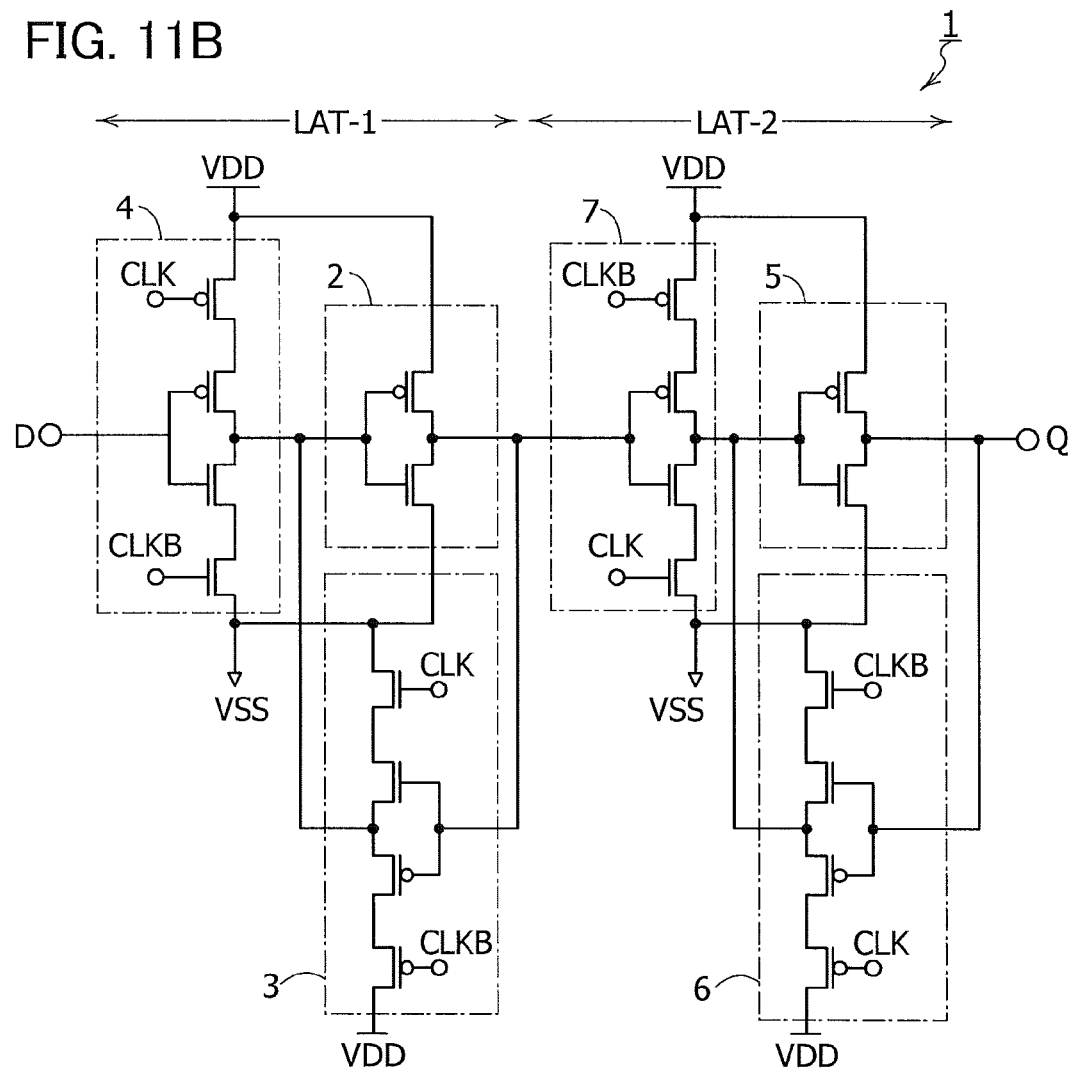
FIG. 11B is an equivalent circuit diagram of FIG. 11A.

As is clear from the circuit diagrams in FIG. 2B and FIG. 11B, the number of transistors in FF 101 is smaller than that in the conventional FF 1. Thus, the circuit size of FF 101 can be decreased. In addition, since the number of transistors in FF 101 is small, dynamic power consumption is reduced. In particular, since the number of transistors controlled by a clock signal is reduced to two, dynamic power consumption can be reduced effectively. Furthermore, the number of Si transistors whose leakage current is higher than that of an OS transistor can be reduced; thus, static power consumption can also be reduced.

A semiconductor device includes a large number of FFs; however, by using FF 101 as each FF, the dynamic and static power consumption of the semiconductor device can be reduced. In addition, a rise in temperature can be inhibited while the semiconductor device operates; thus, the operating frequency of the semiconductor device can be increased.

(Driving Method)

FIG. 2C shows waveforms of the input signals (CLK, CLKB, and data signal D) and the output signal (data signal Q), and changes in voltages of the nodes CP and DB.

In FF 101, the data signal D input from the input terminal in is sequentially transferred to the nodes CP and DB in response to CLK and CLKB and is output from the output terminal out as the data signal Q. Mos 1 is turned on and Mos 2 is turned off when CLK is "L," and the output voltage of INV 10 is supplied to CAP 1. Data is retained in CAP 1 as voltage. Then, Mos 1 is turned off and Mos 2 is turned on when CLK is set at "H"; thus, the logic value of the data retained in CAP 1 is inverted in INV 11 and the data is output from the output terminal out as the data signal Q.

When Mos 1 and Mos 2 are each formed using an OS transistor whose off-state current is extremely low, the voltage of the node CP can be held for a certain period even after supply of the clock signals CLK and CLKB is stopped. Thus, clock gating can be performed on FF 101. By stopping the supply of the clock signals CLK and CLKB and turning off one of Mos 1 and Mos 2, the internal state of the flip-flop 101 can be held. Stopping the supply of clock signals means stopping oscillation of CLK and CLKB and fixing the potential level of CLK at "L" or "H." In FF 101, by stopping the supply of the clock signals, CLK may be fixed at "L" (CLKB may be fixed at "H") or "H" (CLKB may be fixed at "L"). When the supply of the clock signals is stopped, CLK is preferably fixed at "H" and the node DB is preferably connected to the node CP. Thus, the voltage of the node DB in this period can be held in CAP 1, so that variations in the voltage can be further reduced.

Alternatively, by stopping the supply of the clock signals, CLK and CLKB may be fixed at "L." In that case, the node CP can be electrically floating; thus, variations in the voltage of the node CP can be reduced while the supply of the clock signals is stopped.

Clock gating can reduce the dynamic power consumption of FF 101. In addition, after the supply of the clock signals is stopped, supply of VDD to INV 10 and INV 11 can be stopped, so that power consumption can be further reduced.

Structure Example 2

Figure 3A:
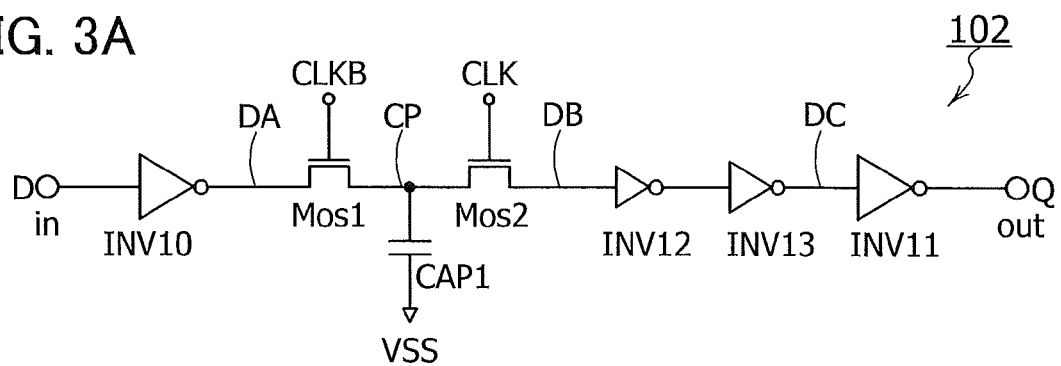
FIG. 3A is a circuit diagram illustrating a structure example of an FF.
Figure 3B:
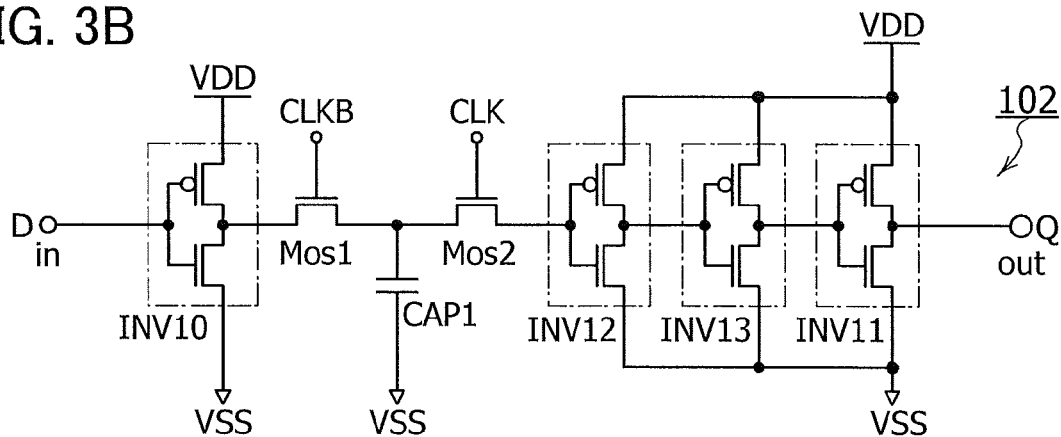
FIG. 3B is an equivalent circuit diagram of FIG. 3A.

In FF 101, the capacitance of CAP 1 needs to be high enough to accumulate electric charge with which INV 11 can be driven while Mos 1 is on. When the capacitance of CAP 1 is high, FF 101 operates slowly, which causes data delay. In addition, even when the number of transistors is decreased, the area of FF 101 is not reduced sufficiently in some cases. Here, structure examples for decreasing the capacitance of CAP 1 are described with reference to FIGS. 3A and 3B. FIG. 3A is a circuit diagram illustrating a structure example of an FF, and FIG. 3B is an equivalent circuit diagram of FIG. 3A.

FF 102 is obtained by addition of two inverters INV 12 and INV 13 to FF 101. FF 102 is also obtained by forming the logic circuit 110 of FF 21 by one inverter INV 10 and forming the logic circuit 111 of FF 21 by three inverters INV 11 to INV 13.

INV 12 and INV 13 are connected to each other in series between the node DB and an input terminal (node DC) of NV 11. INV 12 and INV 13 can be CMOS inverters as in NV 11 (FIG. 3A), and may be formed using Si transistors, for example. FF 102 can be driven as in FF 101 (see FIG. 2C).

To decrease the capacitance of CAP 1, the size of the transistor included in INV 12 that is connected to the node DB is made smaller than that of INV 11. Thus, the gate capacitance of the transistor in INV 12 is decreased, that is, the capacitance of the node DB is decreased, so that the capacitance of CAP 1 can be reduced by the decrease in the capacitance. The transistor size may be adjusted by changing either one or both channel width W and channel length L.

In addition, as in FF 22, the capacitor CAP 11 may be connected to the node DB in FF 102. Since the gate capacitance of the transistor in INV 12 is low, the capacitance of CAP 11 as well as the capacitance of CAP 1 can be decreased.

The drive capability of INV 12 is decreased because the transistor size is decreased; thus, INV 13 compensates the decrease in drive capability and has a function of amplifying an output of INV 12. To improve the drive capability of the inverter, the closer the inverter is to the output terminal out of FF 102, the larger the transistor in the inverter is. For example, in INV 11 to INV 13, the channel lengths L of n-channel transistors and p-channel transistors are the same, but the channel widths W of the n-channel transistors and the p-channel transistors are different. The channel widths W of the n-channel transistors and the p-channel transistors in INV 11 to INV 13 satisfy the following relationship: INV 12<INV 13<INV 11. For example, if W of INV 12 is 1, W of INV 13 is k (k>1, for example, k=3) and W of INV 11 is $k^2$.

The number of transistors in FF 102 is larger than that in FF 101 but is smaller than that in the conventional FF 1 (see FIG. 11B). In addition, the number of transistors controlled by a clock signal is two as in FF 101. This means that as in FF 101, dynamic and static power consumption can be reduced in FF 102.

Structure Example 3

Figure 4A:
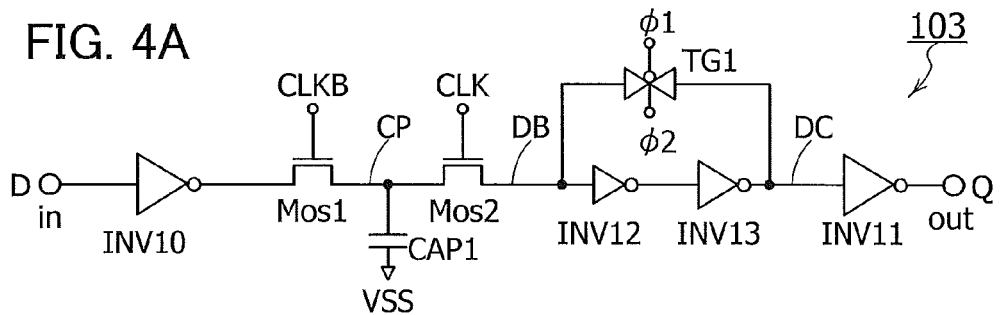
FIG. 4A is a circuit diagram illustrating a structure example of an FF.
Figure 4B:
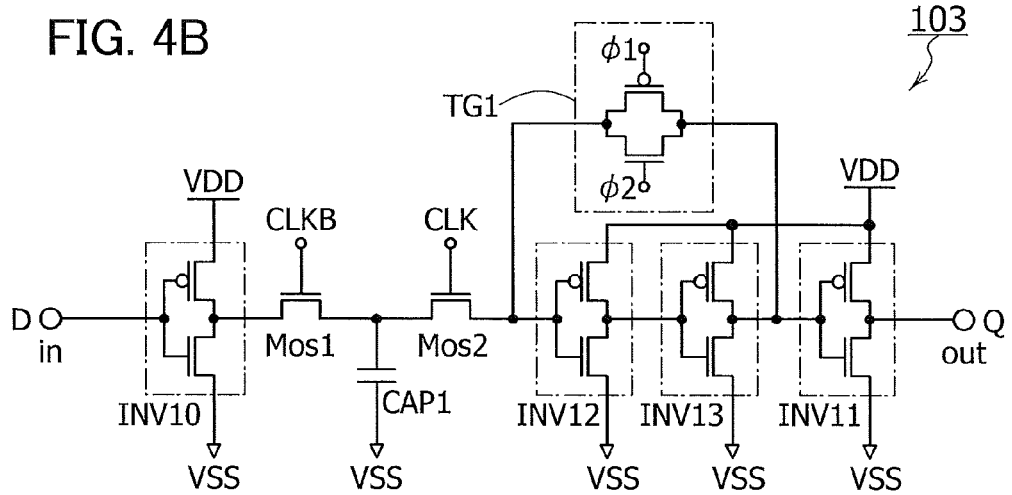
FIG. 4B is an equivalent circuit diagram of FIG. 4A.

In FF 102 (FIGS. 3A and 3B), the transistors in INV 12 are scaled; thus, the gate leakage current of these transistors might be increased. For example, in a sleep state (clock-signal stop state) or in the case of a long-cycle clock signal, electric charge held in CAP 1 might leak from a gate of the transistor in INV 12. Here, structure examples for improving data retention characteristics in a sleep state are described with reference to FIGS. 4A and 4B. FIG. 4A is a circuit diagram illustrating a structure example of an FF, and FIG. 4B is an equivalent circuit diagram of FIG. 4A.

To retain data input to INV 12 in a sleep state, INV 12 and INV 13 form a loop circuit. Therefore, a switch that connects an output terminal (node DC) of INV 13 to an input terminal (node DB) of INV 12 is provided. FF 103 includes a transfer gate circuit TG 1 as the switch.

In addition, as in FF 22, the capacitor CAP 11 may be connected to the node DB in FF 103.

Although FF 103 is obtained by addition of two transistors to FF 102, the number of transistors in FF 103 is smaller than that in the conventional FF 1 (FIGS. 11A and 11B). Furthermore, the number of transistors controlled by a clock signal is smaller than that in the conventional FF 1. Thus, as in FF 102, dynamic and static power consumption can be reduced in FF 103.

A transfer gate circuit is a circuit in which an n-channel transistor and a p-channel transistor are connected to each other in parallel and is referred to as an analog switch circuit, a transmission gate circuit, or the like. In TG 1, a signal φ1 is input to a gate of a p-channel transistor, and a signal φ2 is input to a gate of an n-channel transistor (FIG. 4B). The phases of the signal φ1 and the signal φ2 are inverted from each other. When φ1 is "L" (φ2 is "H"), the node DC is connected to the node DB.

For example, in normal operation, φ1 is always "H" to keep TG 1 off. In the sleep state, φ1 is set at "L" to turn on TG 1. In the loop circuit (latch circuit) constituted by INV 12 and INV 13, data input to the node DB is retained; thus, even in the sleep state, FF 103 can prevent data loss more reliably. Thus, INV 12 and INV 13 are scaled easily.

Note that even in the normal operation, while Mos 2 is off, TG 1 is turned on so that the loop circuit constituted by INV 12 and INV 13 can retain data. In that case, CLK and CLKB are input as φ1 and φ2, respectively, in the normal operation, and φ1 is kept at "L" and φ2 is kept at "H" in the sleep state.

Figure 4C:
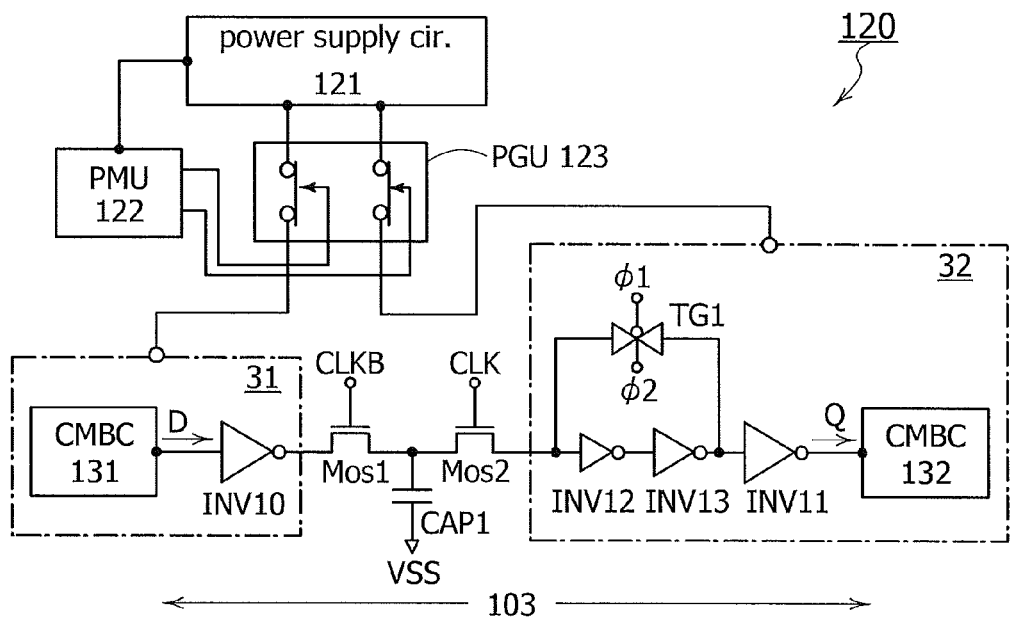
FIG. 4C is a block diagram illustrating a structure example of a semiconductor device including the FF.

Since the loop circuit (INV 12 and INV 13) retains data in the sleep state, supply of power to INV 10 in FF 103 can be stopped. FIG. 4C illustrates a structure example of a semiconductor device that can perform such power gating.

A semiconductor device 120 includes a power supply circuit 121, a power management unit (PMU) 122, a power gating unit (PGU) 123, and combinational circuits (CMBC) 131 and 132. Note that the power supply circuit 121 is not necessarily provided in the semiconductor device 120, and power may be supplied from an external power supply circuit to the semiconductor device 120.

CMBC 131 is connected to the input terminal in of FF 103, and CMBC 132 is connected to the output terminal out of FF 103.

PGU 123 includes a switch circuit group that connects circuits (FF 103, CMBC 131, and CMBC 132) to the power supply circuit 121. PMU 122 has a function of controlling whether to supply or stop power to the circuits in the semiconductor device 120. PMU 122 generates and outputs a control signal for controlling PGU 123. This control signal controls the on and off states of the switch circuits included in PGU 123 to supply and stop power. Blocks 31 and 32 each represent a circuit group in which power supply is controlled by the same control sequence.

CMBC 131 and CMBC 132 perform power gating independently. In FIG. 4C, this feature enables fine-grained power gating by independently performing power gating on INV 10 on the input terminal in side of FF 103 and INV 11 to INV 13 on the output terminal out side of FF 103. INV 10 is included in the same block 31 as CMBC 131, and INV 11 to INV 13 are included in the same block 32 as CMBC 132.

PMU 122 stops supply of power to the block 31 while CMBC 131 does not need to operate. Before the supply of power to the block 31 is stopped, TG 1 is turned on, supply of clock signals is stopped, and FF 103 is set in a sleep state. Thus, in FF 103, supply of power to INV 10 that is not required for data retention is stopped in the sleep state, so that dynamic power consumption is reduced.

Structure Example 4

Figure 5A:
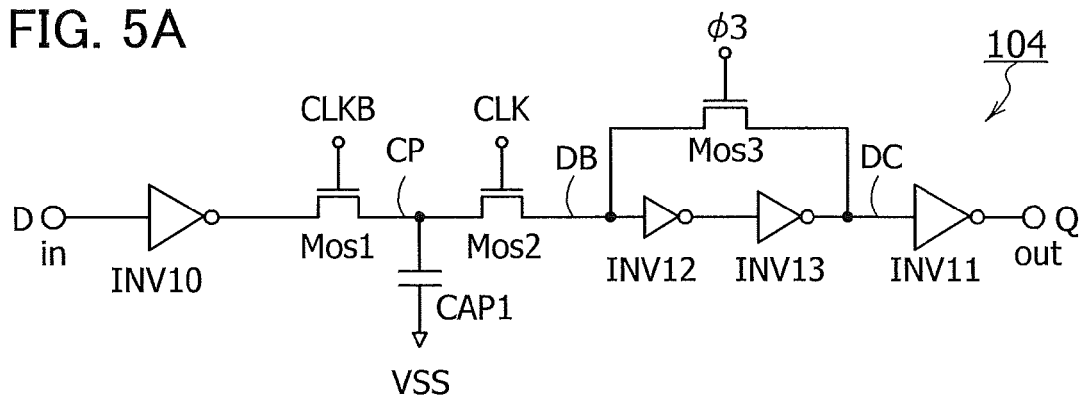
FIG. 5A is a circuit diagram illustrating a structure example of an FF.
Figure 5B:
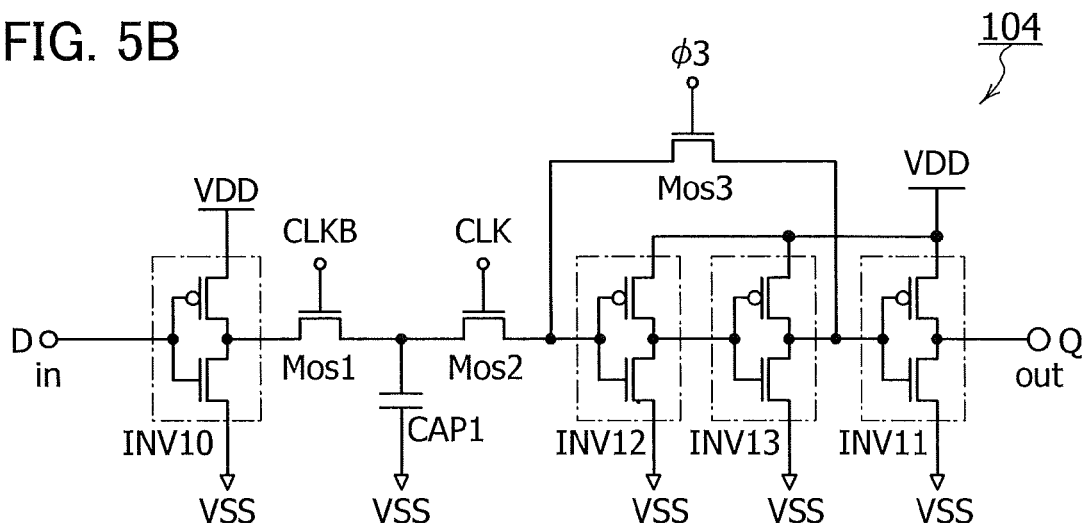
FIG. 5B is an equivalent circuit diagram of FIG. 5A.

In the structure example 3, the transfer gate circuit TG 1 is used as the switch that connects the node DC to the node DB; however, the switch is not limited thereto. For example, an OS transistor can be used. FIG. 5A illustrates a structure example of such an FF. FIG. 5B is an equivalent circuit diagram of FIG. 5A.

As illustrated in FIG. 5A, FF 104 is obtained by replacing TG 1 in FF 103 with a transistor Mos 3. FF 104 can also perform power gating as illustrated in FIG. 4C. In addition, as in FF 22, the capacitor CAP 11 may be connected to the node DB in FF 104.

The transistor Mos 3 is an OS transistor. A signal φ3 is input to a gate of the transistor Mos 3. In normal operation, φ3 is set at "L" to turn off Mos 3. In a sleep state, φ3 is set at "H" to turn on Mos 3.

Structure Example 5

Figure 6:
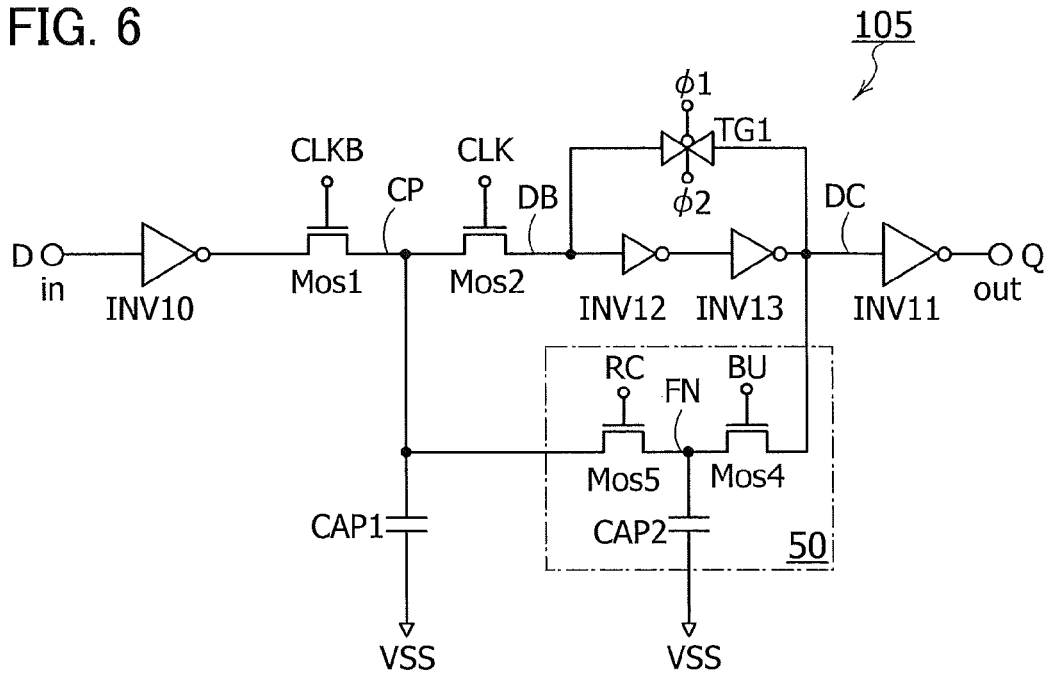
FIG. 6 is a circuit diagram illustrating a structure example of an FF.

A structure example of an FF in which supply of power to all the inverters included in the FF is stopped is described. Here, a structure example of an FF in which data can be retained even when a power-supply stop state continues for a long time is described. FIG. 6 illustrates a structure example of an FF.

FF 105 is obtained by addition of a circuit 50 to FF 103. The circuit 50 is a memory circuit for data backup when power supply is stopped. The circuit 50 does not operate while FF 105 performs normal operation; thus, the circuit 50 can also be referred to as a shadow memory.

The circuit 50 includes a transistor Mos 4, a transistor Mos 5, and a capacitor CAP 2. Mos 4 and Mos 5 are connected to each other in series between the node DC and the node CP. A signal BU that is a trigger for data backup operation is input to a gate of Mos 4. A signal RC that is a trigger for data recovery operation is input to a gate of Mos 5. CAP 2 is connected to a connection portion (node FN) of Mos 4 and Mos 5. Mos 4 functions as a switch that connects the node DC to the node FN. Mos functions as a switch that connects the node DB to the node FN.

The circuit 50 has a function of retaining the voltage of the node DC as backup data and a function of reading retained data to the node CP.

In normal operation of FF 105 or in a sleep period, the node FN is not connected to FF 105. Thus, the signals BU and RC are set at "L" to turn off Mos 4 and Mos 5. The operation of FF 105 in this period is similar to that of FF 103.

In the case where FF 105 is powered off, after data is backed up to the circuit 50, supply of power and clock signals is stopped. In data backup, the signal BU is set at "H" to turn on Mos 4, and the node DC is connected to the node FN. Thus, electric charge based on the voltage of the node DC is accumulated in CAP 2. In the case where a data value is "0," the node FN is set at a high level. In the case where the data value is "1," the node FN is set at a low level. Then, the signal BU is set at "L" again, so that the supply of power and clock signals is stopped.

In this state, the node FN is electrically floating and the circuit 50 retains data. In the case where the node FN is at a high level, electric charge leaks from CAP 2 and the voltage of CAP 2 gradually decreases. However, Mos 4 and Mos 5 are OS transistors having extremely low off-state current; thus, the circuit 50 can retain data on a daily, weekly, or yearly basis. Consequently, even in a power-off period due to power gating, FF 105 does not lose data.

In the case where the supply of power to FF 105 is restarted, for example, after data is recovered, the supply of power and clock signals is restarted. In data recovery, the signal RC is set at "H" to turn on Mos 5. As a result, the node CP is connected to the node FN, so that CAP 1 is charged by electric charge accumulated in CAP 2, and the data is recovered to FF 105. Then, the signal RC is set at "L" and the supply of power and clock signals is restarted, so that FF 105 performs normal operation.

As in FF 22, the capacitor CAP 11 may be connected to the node DB in FF 105. FIG. 6 illustrates an example in which the circuit 50 is provided in FF 103; however, the circuit 50 can be similarly provided in another FF (101, 102, or 104). In the case where the circuit 50 is provided in FF 101, Mos 4 is provided as a switch that connects the node DB to the node FN.

Structure Example 6

Figure 7:
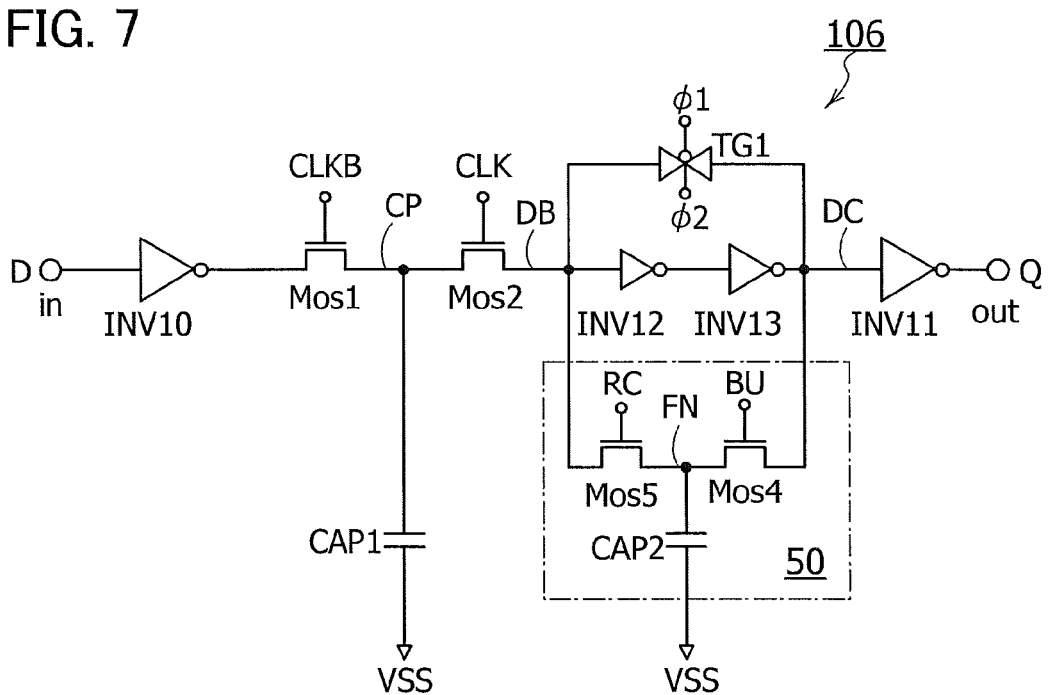
FIG. 7 is a circuit diagram illustrating a structure example of an FF.

In the structure example 5, data backed up in the circuit 50 is recovered to the node CP; however, the data can be recovered to the node DB. FIG. 7 illustrates an example of such a structure.

In FF 106, the transistor Mos 5 in the circuit 50 is provided as a switch that connects the node FN to the node DB.

In FF 106, in the case where power supply is restarted, for example, after power supply is restarted to operate INV 10 to INV 13, data of the circuit 50 is recovered to the node DB. Then, supply of clock signals is restarted. To recover the data of the circuit 50, the signal RC is set at "H" to turn on Mos 5, and data retained in the node FN is written to the node DB. Since INV 11 to INV 13 operate, the data signal Q based on the voltage level of the node DB is output from FF 106. Then, after the signal RC is set at "L," the supply of clock signals is restarted, so that FF 106 performs normal operation.

As in FF 22, the capacitor CAP 11 may be connected to the node DB in FF 106. FIG. 7 illustrates an example in which the circuit 50 is provided in FF 103; however, the circuit 50 can be similarly provided in another FF (102 or 104).

Structure Example 7

In the structure examples 1 to 6, the FF includes inverters as the logic circuits 110 and 111 (FIGS. 1A to 1C). However, the logic circuits 110 and 111 are not limited to inverters. Any circuit can be used as the logic circuit 110 as long as it can transmit the input data signal D of the flip-flop circuit to the node CP. In addition, any circuit can be used as the logic circuit 111 as long as it can transmit data retained in the node CP to the output terminal out.

For example, as each of the logic circuits 110 and 111, a NAND circuit, a NOR circuit, a buffer circuit, a multiplexer (selector circuit), or the like can be used instead of an inverter. Alternatively, a combinational logic circuit in which these logic circuits, transistors, and the like are combined can be used.

Figure 8A:
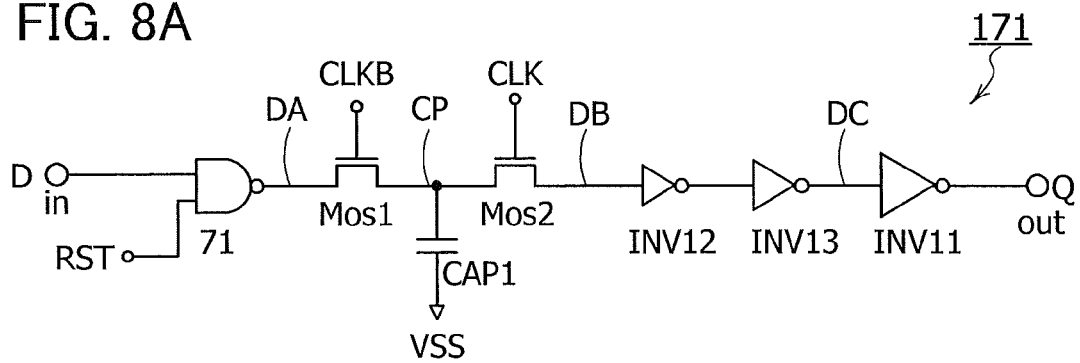
FIGS. 8A to 8C are circuit diagrams each illustrating a structure example of an FF.

FIG. 8A illustrates a structure example of an FF including a NAND circuit. FF 171 in FIG. 8A is obtained by replacing INV 10 in FF 102 (FIG. 3A) with a NAND circuit 71. FF 171 is also obtained by replacing the logic circuit 110 in FF 21 (FIG. 1A) with the NAND circuit 71 and replacing the logic circuit 111 with INV 11 to INV 13.

The data signal D is input to one input terminal of the NAND circuit 71, and a signal RST is input to the other input terminal of the NAND circuit 71. The signal RST is a reset signal. In normal operation, RST is a high-level signal. In the case where FF 171 is reset, a low-level signal is input as RST. Thus, an output signal of the NAND circuit 71 is "H" regardless of the data value of the data signal D. Consequently, by setting the signal RST at a low level, FF 171 can be reset regardless of the data value of the data signal D while retaining data "0." The signal RST can be a data signal.

Figure 8B:
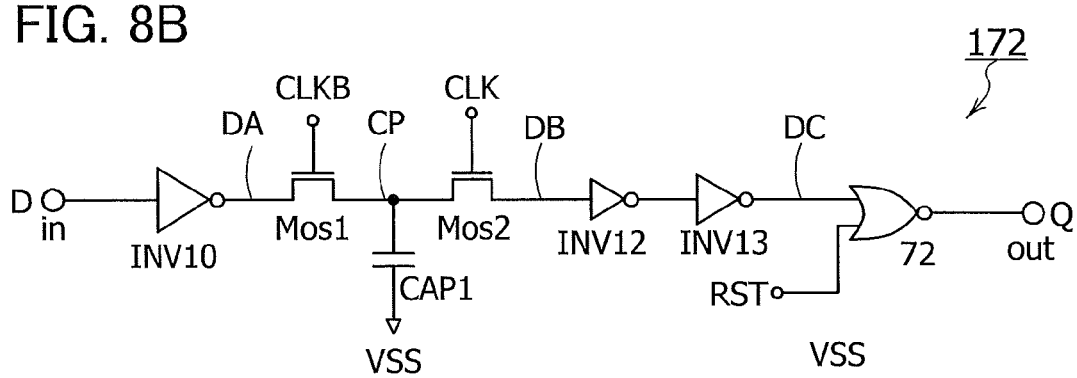

FIG. 8B illustrates a structure example of an FF including a NOR circuit. FF 172 is obtained by replacing INV 11 in FF 102 with a NOR circuit 72. FF 172 is also obtained by replacing the logic circuit 110 in FF 21 with INV 10 and replacing the logic circuit 111 with INV 12, INV 13, and the NOR circuit 72.

One input terminal of the NOR circuit 72 is connected to the node DC, and the signal RST is input to the other input terminal of the NOR circuit 72. In normal operation, "L" is input to the NOR circuit 72 as the signal RST. In the case where FF 172 is reset, "H" is input to the NOR circuit 72 as the signal RST. Thus, FF 172 can output a low-level signal as the data signal Q. The signal RST can be a data signal.

Figure 8C:
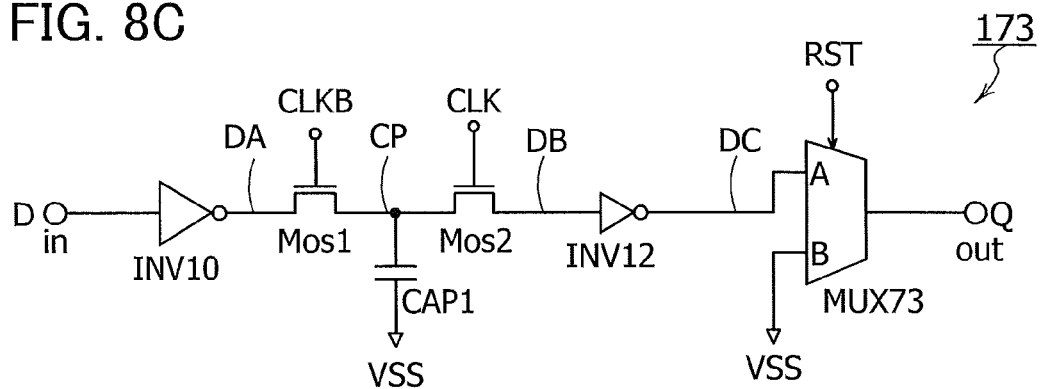

FIG. 8C illustrates a structure example of an FF including a multiplexer. FF 173 has a circuit structure in which INV 11 in FF 102 is replaced with a multiplexer (MUX) 73. In addition, FF 173 is obtained by replacing the logic circuit 110 in FF 21 with INV 10 and replacing the logic circuit 111 with INV 12 and MUX 73.

One input terminal (A) of MUX 73 is connected to the node DC, and the other input terminal (B) of MUX 73 is connected to a wiring for supplying VSS. MUX 73 outputs one of signals input from the two input terminals A and B in response to the signal RST. For example, MUX 73 outputs the signal input from the input terminal A when the signal RST is "L," and outputs the signal input from the input terminal B when the signal RST is "H." In that case, in normal operation, RST is set at "L." In the case where FF 173 is reset, RST is set at "H." Thus, FF 173 can output a low-level signal as the data signal Q.

As in FF 22, the capacitor CAP 11 may be connected to the node DB in FF 171 to FF 173.

Structure Example 8

The OS transistors Mos 1 to Mos 5 used in the FF in this embodiment may each include a back gate. By applying positive bias voltage or reverse biased voltage to the back gate, the threshold voltage of the OS transistor can be controlled.

For example, voltage that is lower than VSS is applied to the back gate. In that case, the threshold voltage of the OS transistor can be shifted in a negative voltage direction. Consequently, while supply of a control signal to the gate is stopped, the OS transistor can be turned off reliably, so that the off-state leakage current of the OS transistor in this period can be further reduced.

As described above, the dynamic and static power consumption of the FF in this embodiment can be reduced. Thus, the power consumption of a semiconductor device including the FF in this embodiment can be reduced. In addition, a rise in temperature can be inhibited while the semiconductor device operates; thus, the operating frequency of the semiconductor device can be increased.

This embodiment can be combined with any of the other embodiments as appropriate.

Embodiment 2

In this embodiment, a specific device structure of a semiconductor device including a flip-flop circuit is described.

<Device Structure>

FIG. 9A is a cross-sectional view illustrating a device structure example of a semiconductor device including an FF. A die 600 in FIG. 9A corresponds to a die included in the semiconductor device. FIG. 9A is not a cross-sectional view of the die 600 taken along a specific section line but a drawing for illustrating a layered structure of the die 600. FIG. 9A typically illustrates a cross-sectional structure of the FF 101 (FIGS. 2A and 2B).

The die 600 is formed using a semiconductor substrate. A bulk single-crystal silicon wafer 601 is used as the semiconductor substrate. Note that a substrate for forming a backplane of the die 600 is not limited to the bulk single-crystal silicon wafer but can be any of a variety of semiconductor substrates. For example, an SOI semiconductor substrate including a single-crystal silicon layer may be used.

Transistors Mp 10 and Mn 10 are Si transistors included in INV 10, and transistors Mp 11 and Mn 11 are Si transistors included in INV 11. Mp 10 and Mp 11 are p-channel transistors, and Mn 10 and Mn 11 are n-channel transistors. The transistors Mos 1 and Mos 2 and the capacitor CAP 1 are stacked over INV 10 and INV 11.

The transistors Mp 10, Mn 10, Mp 11, and Mn 11 can be formed using the single-crystal silicon wafer 601 by a known CMOS process. An insulating layer 610 electrically isolates these transistors from each other. An insulating layer 611 is formed to cover the transistors Mp 10, Mn 10, Mp 11, and Mn 11. Conductors 631 to 636 are formed over the insulating layer 611. Conductors 621 to 628 are formed in openings formed in the insulating layer 611. As illustrated in FIG. 9A, the conductors 621 to 628 and 631 to 636 connect Mp 10 and Mp 11 to Mn 10 and Mn 11, respectively.

One wiring layer or two or more wiring layers are formed over the transistors Mp 10, Mn 10, Mp 11, and Mn 11 by a wiring process (BEOL: back end of the line). Here, three wiring layers are formed using insulating layers 612 to 614 and conductors 641 to 646, 651 to 656, and 661 to 665.

An insulating layer 711 is formed to cover the wiring layers. The transistors Mos 1 and Mos 2 and the capacitor CAP 1 are stacked over the insulating layer 711.

The transistor Mos 1 includes an oxide semiconductor (OS) layer 701 and conductors 721, 722, and 731. A channel formation region is formed in the OS layer 701. The conductor 731 constitutes a gate electrode. The conductors 721 and 722 constitute a source electrode and a drain electrode, respectively. The conductor 721 is connected to INV 10 by the conductors 641 to 646.

The transistor Mos 2 includes an oxide semiconductor (OS) layer 702 and conductors 722, 723, and 733. A channel formation region is formed in the OS layer 702. The conductor 733 constitutes a gate electrode. The conductors 722 and 723 constitute a source electrode and a drain electrode, respectively. The conductor 723 is connected to INV 11 by the conductors 651 to 656.

The capacitor CAP 1 is an MIM capacitor. The capacitor CAP 1 includes the conductor 722 and a conductor 732 as electrodes and includes an insulating layer 712 as a dielectric substance (insulating film). The insulating layer 712 also serves as an insulator that constitutes gate insulating layers of Mos 1 and Mos 2.

An insulating layer 713 is formed to cover Mos 1, Mos 2, and CAP 1. Conductors 741 to 743 are formed over the insulating layer 713. The conductors 741 to 743 are connected to Mos 1, Mos 2, and CAP 1, respectively, and are provided as electrodes (wirings) for connecting these elements to wirings in the wiring layers. For example, as illustrated in FIG. 9A, the conductor 743 is connected to the conductor 661 by the conductors 662 to 665 and a conductor 724. The conductors 741 and 742 are connected to the wirings in the wiring layers as in the conductor 743.

Each of the insulating layers of the die 600 can be formed using one insulating film or two or more insulating films. Examples of such an insulating film include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film. These insulating films can be formed by sputtering, CVD, MBE, ALD, or PLD.

In this specification, an oxynitride refers to a substance that includes more oxygen than nitrogen, and a nitride oxide refers to a substance that includes more nitrogen than oxygen.

Each of the conductors of the die 600 can be formed using one conductive film or two or more conductive films. Such a conductive film can be a metal film containing aluminum, chromium, copper, silver, gold, platinum, tantalum, nickel, titanium, molybdenum, tungsten, hafnium, vanadium, niobium, manganese, magnesium, zirconium, beryllium, or the like. Such a conductive film can be an alloy film containing any of these metals as a component, a compound film containing any of these metals as a component, or a polycrystalline silicon film containing an impurity element such as phosphorus, or the like.

The insulating layers, conductors, semiconductors, and oxide semiconductors included in the die 600 are preferably formed by sputtering; chemical vapor deposition (CVD) such as metal organic chemical vapor deposition (MOCVD), atomic layer deposition (ALD), or plasma-enhanced CVD (PECVD); vacuum vapor deposition; or pulse laser deposition (PLD). To reduce damage by plasma, MOCVD or ALD is preferably used.

The structures of the Si transistor and the OS transistor included in the die 600 are not limited to those in FIG. 9A. For example, the OS transistor may include a back gate. In that case, an insulating layer and a conductor that constitutes a back gate over the insulating layer may be formed between the conductors 646, 656, and 665 and the conductors 721 to 724. Alternatively, the OS transistor can have a structure as illustrated in FIG. 9B. In FIG. 9B, the transistor Mos 1 further includes an OS layer 703. Also in Mos 1 in FIG. 9B, a channel formation region is formed in the OS layer 701.

To form Mos 1 in FIG. 9B, after the conductors 721 and 722 are formed, one oxide semiconductor film or two or more oxide semiconductor films used for the OS layer 703, an insulating film used for the insulating layer 712, and a conductive film used for the conductor 731 are stacked. Then, by etching this stacked film with the use of a resist mask for etching the conductive film, the OS layer 703 and the conductor 731 are formed. The transistor Mos 2 is formed similarly. In CAP 1, the insulating layer 712 in a region that is not covered with the conductor 743 is removed.

<Oxide Semiconductor>

Next, an oxide semiconductor used for an OS transistor is described.

A channel formation region of an OS transistor is preferably formed using a highly purified oxide semiconductor (purified OS). A purified OS refers to an oxide semiconductor obtained by reduction of impurities such as moisture or hydrogen that serve as electron donors (donors) and reduction of oxygen vacancies. By highly purifying an oxide semiconductor in this manner, the conductivity type of the oxide semiconductor can be intrinsic or substantially intrinsic. The term "substantially intrinsic" means that the carrier density of an oxide semiconductor is lower than $1\times10^{17}/cm^3$. The carrier density is preferably lower than $1\times10^{15}/cm^3$, more preferably lower than $1\times10^{13}/cm^3$.

By forming the channel formation region using a purified OS, the off-state current of the OS transistor that is normalized by channel width can be as low as several yoctoamperes per micrometer to several zeptoamperes per micrometer at room temperature.

In the oxide semiconductor, hydrogen, nitrogen, carbon, silicon, and metal elements that are not main components are impurities. For example, hydrogen and nitrogen form donor levels to increase the carrier density. Silicon forms impurity levels in the oxide semiconductor. The impurity level becomes a trap, which might degrade the electrical characteristics of the OS transistor. It is preferable to reduce the concentration of the impurities in the oxide semiconductor and at an interface with another layer.

To make the oxide semiconductor intrinsic or substantially intrinsic, the oxide semiconductor is preferably highly purified to approximately any of the following impurity concentration levels. The following impurity concentrations are obtained by secondary ion mass spectrometry (SIMS) analysis at a certain depth of an oxide semiconductor layer or in a certain region of the oxide semiconductor layer. The purified OS has any of the following impurity concentration levels.

For example, in the case where the impurity includes silicon, the concentration of silicon is lower than $1\times10^{19}$ atoms/cm$^3$, preferably lower than $5\times10^{18}$ atoms/cm$^3$, more preferably lower than $1\times10^{18}$ atoms/cm$^3$.

For example, in the case where the impurity includes hydrogen, the concentration of hydrogen is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

For example, in the case where the impurity includes nitrogen, the concentration of nitrogen is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In the case where the oxide semiconductor including crystals contains silicon or carbon at high concentration, the crystallinity of the oxide semiconductor might be lowered. In order not to lower the crystallinity of the oxide semiconductor, for example, the concentration of silicon is set lower than $1\times10^{19}$ atoms/cm$^3$, preferably lower than $5\times10^{18}$ atoms/cm$^3$, more preferably lower than $1\times10^{18}$ atoms/cm$^3$. For example, the concentration of carbon is set lower than $1\times10^{19}$ atoms/cm$^3$, preferably lower than $5\times10^{18}$ atoms/cm$^3$, more preferably lower than $1\times10^{18}$ atoms/cm$^3$.

As the oxide semiconductor used for the OS transistor, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide means an oxide containing In, Ga, and Zn, and there is no limitation on the ratio of In, Ga, and Zn. The In—Ga—Zn-based oxide may contain a metal element other than In, Ga, and Zn. An oxide semiconductor having an appropriate composition may be formed in accordance with needed electrical characteristics (e.g., mobility and threshold voltage).

For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above composition is preferably used. In this specification, the atomic ratio of the oxide semiconductor varies within a range of ±20% as an error.

For example, in the case where an In—Ga—Zn-based oxide is deposited by sputtering, it is preferable to use an In—Ga—Zn-based oxide target with an atomic ratio of In:Ga:Zn=1:1:1, 5:5:6, 4:2:3, 3:1:2, 1:1:2, 2:1:3, 1:3:2, 1:3:4, 1:4:4, 1:6:4, or 3:1:4 as an In—Ga—Zn-based oxide deposition target. When an In—Ga—Zn-based oxide semiconductor film is deposited using such a target, a crystal part is formed in the oxide semiconductor film easily. The filling factor of such a target is preferably higher than or equal to 90%, more preferably higher than or equal to 95%. With a target having a high filling factor, a dense oxide semiconductor film can be deposited.

For example, it is preferable to use an In—Zn-based oxide target with an atomic ratio of In:Zn=50:1 to 1:2 (a molar ratio of $In_2O_3$:ZnO=25:1 to 1:4) as an In—Zn-based oxide deposition target. The atomic ratio of In:Zn is preferably 15:1 to 1.5:1 (the molar ratio of $In_2O_3$:ZnO=15:2 to 3:4). For example, in an In—Zn-based oxide deposition target with an atomic ratio of In:Zn:O=X:Y:Z, the relation Z>1.5X+Y is preferably satisfied. The mobility of an In—Zn-based oxide film can be increased by keeping the ratio of Zn within the above range.

<Structure of Oxide Semiconductor Film>

The structure of the OS layer of the OS transistor is described below.

The OS layer may be formed using a single-crystal oxide semiconductor film or a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films having a plurality of crystal parts.

In the description of a crystal structure, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°. The term "substantially parallel" indicates that an angle formed between two straight lines is −30 to 30°. In addition, the term "substantially perpendicular" indicates that an angle formed between two straight lines is 60 to 120°.

<CAAC-OS Film>

The CAAC-OS film is described in detail below.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

In an electron diffraction pattern of the CAAC-OS film, spots (bright spots) indicating alignment are observed.

From the results of the high-resolution cross-sectional TEM image and the high-resolution planar TEM image, alignment is found in the crystal parts in the CAAC-OS film.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 $nm^2$, larger than or equal to 5 $\mu m^2$, or larger than or equal to 1000 $\mu m^2$ is observed in some cases in the high-resolution planar TBM image.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

In addition, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

In an OS transistor including the CAAC-OS film, changes in electrical characteristics of the transistor due to irradiation with visible light or ultraviolet light are small. Thus, the transistor has high reliability.

For example, a CAAC-OS film is deposited by sputtering with a polycrystalline metal oxide target. When ions collide with the target, a crystal region included in the target might be separated from the target along the a-b plane, and a sputtered particle having a plane parallel to the a-b plane (flat-plate-like or pellet-like sputtered particle) might be separated from the target. In that case, the flat-plate-like or pellet-like sputtered particle reaches a substrate while maintaining its crystal state, so that the CAAC-OS film can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is lower than or equal to −80° C., preferably lower than or equal to −100° C. is used.

By increasing the substrate heating temperature during the deposition, when the flat-plate-like or pellet-like sputtered particle reaches the substrate, migration occurs on the substrate, so that a flat plane of the sputtered particle is attached to the substrate. For example, the substrate heating temperature during the deposition is 100 to 740° C., preferably 200 to 500° C.

Furthermore, it is possible to reduce plasma damage during the deposition by increasing the proportion of oxygen in the deposition gas and optimizing power. For example, the proportion of oxygen in the deposition gas is higher than or equal to 30 vol %, preferably 100 vol %.

<Polycrystalline Oxide Semiconductor Film>

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a boundary between crystals can be found in some cases.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

<Nc-OS Film>

Next, a microcrystalline oxide semiconductor film is described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Thus, the nc-OS film may have higher carrier density than the CAAC-OS film. The oxide semiconductor film having high carrier density may have high electron mobility. Thus, a transistor including the nc-OS film may have high field-effect mobility. The nc-OS film has higher density of defect states than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because the nc-OS film can be formed even when a comparatively large amount of impurities are included; thus, depending on the purpose, the nc-OS film can be favorably used in some cases. Thus, a semiconductor device that includes the transistor including the nc-OS film can be manufactured with high productivity in some cases.

<Amorphous Oxide Semiconductor Film>

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

The amorphous oxide semiconductor film contains impurities such as hydrogen at a higher concentration than the CAAC-OS film. Furthermore, the amorphous oxide semiconductor film has higher density of defect states than the CAAC-OS film.

The oxide semiconductor film having a high impurity concentration and high density of defect states has many carrier traps or many carrier generation sources.

Accordingly, the amorphous oxide semiconductor film has much higher carrier density than the nc-OS film in some cases. Accordingly, a transistor including the amorphous oxide semiconductor film tends to be normally on. Thus, in some cases, such an amorphous oxide semiconductor film can be used for a transistor that needs to be normally on. Since the amorphous oxide semiconductor film has high density of defect states, carrier traps might be increased. Consequently, a transistor including the amorphous oxide semiconductor film has larger variation in electrical characteristics and lower reliability than a transistor including the CAAC-OS film or the nc-OS film.

<Single-Crystal Oxide Semiconductor Film>

Next, a single-crystal oxide semiconductor film is described.

The single-crystal oxide semiconductor film has a lower impurity concentration and low density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and low density of defect states, carrier traps might be reduced. Thus, the transistor including the single-crystal oxide semiconductor film has small variation in electrical characteristics and has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has higher density than the CAAC-OS film. The CAAC-OS film has higher density than the microcrystalline oxide semiconductor film. The polycrystalline oxide semiconductor film has higher density than the microcrystalline oxide semiconductor film. The microcrystalline oxide semiconductor film has higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS or a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single-crystal oxide semiconductor film having the same composition as the oxide semiconductor film. For example, the density of an a-like OS film is higher than or equal to 78.6% and lower than 92.3% of that of the single-crystal oxide semiconductor film. In addition, for example, the density of an nc-OS film or a CAAC-OS film is higher than or equal to 92.3% and lower than 100% of that of the single-crystal oxide semiconductor film. Note that it is difficult to deposit an oxide semiconductor film whose density is lower than 78% of that of the single-crystal oxide semiconductor film.

Specific examples of the above are described. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Each of the OS layers 701 and 703 of the transistor Mos1 can be formed using one oxide semiconductor film or two or more oxide semiconductor films. In the case where two or more oxide semiconductor films are used, each of the OS layers 701 and 703 may include two or more of an amorphous oxide semiconductor film, an a-like OS film, an nc-OS film, and a CAAC-OS film, for example.

<Another Structure Example of OS Transistor>

For example, in the transistor Mos 1 in FIG. 9A, the OS layer 701 is formed using two oxide semiconductor films including different constituent elements. In that case, a lower layer is formed using an In—Zn-based oxide film and an upper layer is formed using an In—Ga—Zn-based oxide film. Alternatively, each of the lower layer and the upper layer can be formed using an In—Ga—Zn-based oxide film.

For example, in the case where the OS layer 701 is formed using two In—Ga—Zn-based oxide films, one of the films can be formed using an oxide film with an atomic ratio of In:Ga:Zn=1:1:1, 5:5:6, or 3:1:2, and the other of the films can be formed using an oxide film with an atomic ratio of In:Ga:Zn=1:3:2, 1:3:4, 1:3:6, 1:6:4, or 1:9:6.

In FIG. 9B, when the OS layer 701 has a two-layer structure and the OS layer 703 has a single-layer structure, the transistor Mos 1 may be formed using an oxide semiconductor film with a three-layer structure. Also in this case, all or part of the three layers may be formed using oxide semiconductor films including different constituent elements, or the three layers may be formed using oxide semiconductor films including the same constituent element.

For example, in the case where each of the OS layers 701 and 703 is formed using an In—Ga—Zn-based oxide film, each of the lower layer of the OS layer 701 and the OS layer 703 can be formed using an oxide film with an atomic ratio of In:Ga:Zn=1:3:2, 1:3:4, 1:3:6, 1:6:4, or 1:9:6, and the upper layer of the OS layer 701 can be formed using an oxide film with an atomic ratio of In:Ga:Zn=1:1:1, 5:5:6, or 3:1:2.

This embodiment can be combined with any of the other embodiments as appropriate.

Embodiment 3

In this embodiment, semiconductor devices each including a flip-flop circuit (FF) are described.

The FF in Embodiment 1 can be used in a variety of semiconductor devices as a storage circuit that stores output data of a combinational circuit. For example, the FF in Embodiment 1 can be used for a register in a central processing unit (CPU), a microcontroller unit (MCU), a programmable logic device (typically, FPGA), or the like.

As described above, the static and dynamic power consumption of the FF in Embodiment 1 is reduced, so that the power consumption of a processor including the FF can also be reduced. In addition, data can be retained in the FF even in a clock signal shutoff period and in a power-off period; thus, the processor can perform fine-grained clock gating or power gating. Furthermore, the processor can be returned to a normal state at high speed after supply of clock signals or power is restarted.

The processor including the FF in Embodiment 1 can be used as processors of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of such electronic devices are display devices, personal computers, and image reproducing devices provided with recording media (devices that read image data of recording media such as digital versatile discs (DVDs) and have displays for displaying images). Other examples are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 10A to 10F illustrate specific examples of these electronic devices.

Figure 10A:
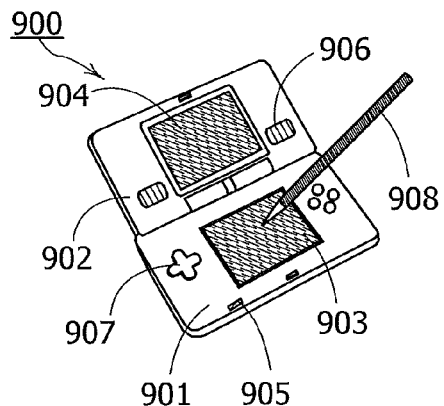
FIGS. 10A to 10F each illustrate an electronic device.

FIG. 10A is an external view illustrating a structure example of a portable game machine. A portable game machine 900 includes a housing 901, a housing 902, a display portion 903, a display portion 904, a microphone 905, a speaker 906, an operation key 907, a stylus 908, and the like.

Figure 10B:
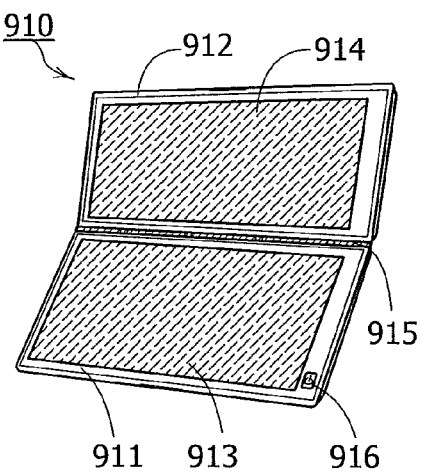

FIG. 10B is an external view illustrating a structure example of a portable information terminal. The portable information terminal 910 includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and an angle between the housings 911 and 912 can be changed with the joint 915. An image on the display portion 913 may be switched depending on the angle between the housings 911 and 912 at the joint 915. A display device with a touch panel may be used as the display portion 913 and/or the display portion 914.

Figure 10C:
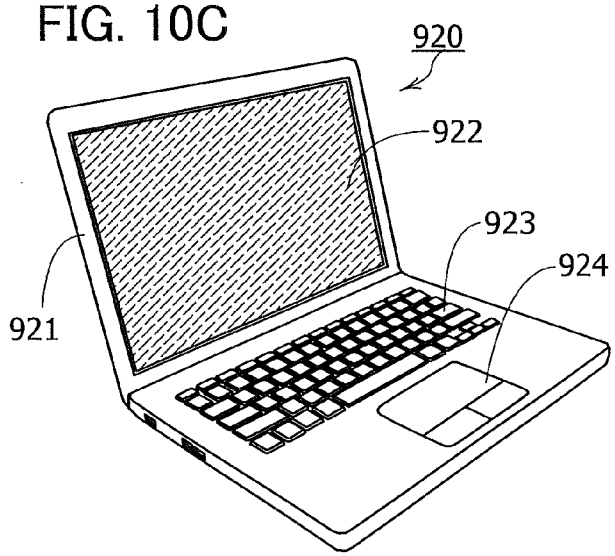

FIG. 10C is an external view illustrating a structure example of a laptop. A personal computer 920 includes a housing 921, a display portion 922, a keyboard 923, a pointing device 924, and the like.

Figure 10D:
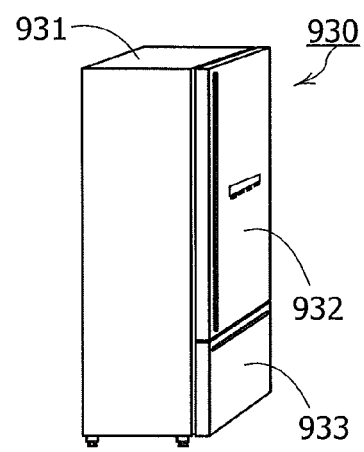

FIG. 10D is an external view illustrating a structure example of an electric refrigerator-freezer. An electric refrigerator-freezer 930 includes a housing 931, a refrigerator door 932, a freezer door 933, and the like.

Figure 10E:
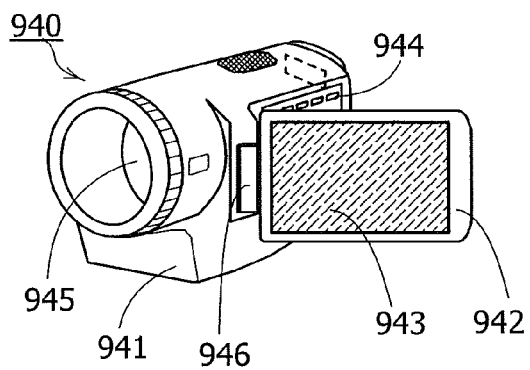

FIG. 10E is an external view illustrating a structure example of a video camera. A video camera 940 includes a housing 941, a housing 942, a display portion 943, operation keys 944, a lens 945, a joint 946, and the like. The operation keys 944 and the lens 945 are provided in the housing 941, and the display portion 943 is provided in the housing 942. The housings 941 and 942 are connected to each other with the joint 946, and an angle between the housings 941 and 942 can be changed with the joint 946. The direction of an image on the display portion 943 may be changed and display and non-display of an image may be switched depending on the angle between the housings 941 and 942.

Figure 10F:
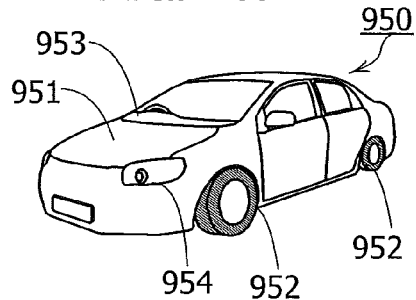

FIG. 10F is an external view illustrating a structure example of a motor vehicle. A motor vehicle 950 includes a car body 951, wheels 952, a dashboard 953, lights 954, and the like.

This embodiment can be combined with any of the other embodiments as appropriate.

REFERENCE NUMERALS

1: flip-flop circuit (FF), 2 and 5: inverter (INV), 4, 6, and 7: clocked inverter (CINV), 10 to 13: inverter (INV), 21 and 22: flip-flop circuit (FF), 31 and 32: block, 50: circuit, 71: NAND circuit, 72: NOR circuit, 73: multiplexer (MUX), 100 to 107: flip-flop circuit (FF), 110 and 111: logic circuit, 120: semiconductor device, 121: power supply circuit, 122: power management unit (PMU), 123: power gating unit (PGU), 131 and 132: combinational circuit (CMBC), 171 to 173: flip-flop circuit (FF), 600: die, 601: single-crystal silicon wafer, 610 to 614: insulating layer, 621 to 628, 631 to 636, 641 to 646, 651 to 656, and 661: conductor, 701 to 703: oxide semiconductor (OS) layer, 711 to 713: insulating layer, 721 to 723, 731 to 734, and 741 to 743: conductor, 900: portable game machine, 901 and 902: housing, 903 and 904: display portion, 905: microphone, 906: speaker, 907: operation key, 908: stylus, 910: portable information terminal, 911 and 912: housing, 913 and 914: display portion, 915: joint, 916: operation key, 920: personal computer, 921: housing, 922: display portion, 923: keyboard, 924: pointing device, 930: electric refrigerator-freezer, 931: housing, 932: refrigerator door, 933: freezer door, 940: video camera, 941 and 942: housing, 943: display portion, 944: operation key, 945: lens, 946: joint, 950: motor vehicle, 951: car body, 952: wheel, 953: dashboard, 954: light, CAP 1 and CAP 2: capacitor, CAP 11: capacitor, and LAT-1 and LAT-2: latch circuit.

This application is based on Japanese Patent Application serial No. 2013-180168 filed with Japan Patent Office on Aug. 30, 2013, the entire contents of which are hereby incorporated by reference.

The invention claimed is:
1. A storage circuit comprising:
a first logic circuit;
a second logic circuit;
a first transistor;
a second transistor;
a third transistor;
a fourth transistor;
a first capacitor;
a second capacitor;
a first node;
a second node; and
a third node,
wherein the first capacitor is connected to the first node,
wherein an input terminal of the second logic circuit is connected to the second node,
wherein the first transistor is configured to control connection between an output terminal of the first logic circuit and the first node,
wherein a first clock signal is input to a gate of the first transistor,
wherein the second transistor is configured to control connection between the first node and the second node,
wherein a second clock signal is input to a gate of the second transistor,
wherein the second capacitor is connected to the third node,
wherein the third transistor is configured to control connection between the input terminal of the second logic circuit and the third node,
wherein the fourth transistor is configured to control connection between the first node and the third node,
wherein phases of the first clock signal and the second clock signal are inverted from each other, and
wherein a channel formation region of each of the first transistor, the second transistor, the third transistor and the fourth transistor includes an oxide semiconductor.

2. The storage circuit according to claim 1, wherein each of the first logic circuit and the second logic circuit is an inverter.

3. A semiconductor device comprising the storage circuit according to claim 1.

4. A storage circuit comprising:
a first logic circuit;
a second logic circuit;
a first inverter;
a second inverter;
a first transistor;
a second transistor;
a third transistor;
a fourth transistor;
a first capacitor;
a second capacitor;
a first node;
a second node;

a third node; and
a fourth node,
wherein the first capacitor is connected to the first node,
wherein an input terminal of the second logic circuit is connected to the fourth node,
wherein the first inverter and the second inverter are connected to each other in series between the second node and the fourth node,
wherein the first transistor is configured to control connection between an output terminal of the first logic circuit and the first node,
wherein a first clock signal is input to a gate of the first transistor,
wherein the second transistor is configured to control connection between the first node and the second node,
wherein a second clock signal is input to a gate of the second transistor,
wherein the second capacitor is connected to the third node,
wherein the third transistor is configured to control connection between the fourth node and the third node,
wherein the fourth transistor is configured to control connection between the first and the third node,
wherein phases of the first clock signal and the second clock signal are inverted from each other, and
wherein a channel formation region of each of the first transistor, the second transistor, the third transistor and the fourth transistor includes an oxide semiconductor.

5. The storage circuit according to claim 4, further comprising a switch configured to connect an input terminal of the first inverter to an output terminal of the second inverter,
wherein while supply of the first clock signal and the second clock signal is stopped, the switch is turned on.

6. The storage circuit according to claim 5,
wherein the switch is a fifth transistor, and
wherein a channel formation region of the fifth transistor includes an oxide semiconductor.

7. The storage circuit according to claim 4, wherein each of the first logic circuit and the second logic circuit is an inverter.

8. A semiconductor device comprising the storage circuit according to claim 4.

9. A semiconductor device comprising:
a first inverter;
a second inverter;
a first transistor;
a second transistor;
a third transistor;
a fourth transistor;
a first capacitor; and
a second capacitor,
wherein an output terminal of the first inverter is connected to one of a source and a drain of the first transistor,
wherein the other of the source and the drain of the first transistor is connected to one of a source and a drain of the second transistor,
wherein the other of the source and the drain of the second transistor is connected to an input terminal of the second inverter,
wherein one of a source and a drain of the third transistor is connected to the input terminal of the second inverter,
wherein the other of the source and the drain of the third transistor is connected to one of a source and a drain of the fourth transistor,
wherein the other of the source and the drain of the fourth transistor is connected to the one of the source and the drain of the second transistor,
wherein the first capacitor is connected to the other of the source and the drain of the first transistor,
wherein the second capacitor is connected to the other of the source and the drain of the third transistor, and
wherein a channel formation region of each of the first transistor, the second transistor, the third transistor and the fourth transistor includes an oxide semiconductor.

10. The semiconductor device according to claim 9, further comprising a third inverter and a fourth inverter and a switch,
wherein an input terminal of the third inverter is connected to the other of the source and the drain of the second transistor,
wherein an output terminal of the third inverter is connected to an input terminal of the fourth inverter,
wherein an output terminal of the fourth inverter is connected to the input terminal of the second inverter,
wherein a first terminal of the switch is connected to the input terminal of the third inverter, and
wherein a second terminal of the switch is connected to the output terminal of the fourth inverter.

11. The semiconductor device according to claim 10
wherein the switch is a fifth transistor, and
wherein a channel formation region of the fifth transistor includes an oxide semiconductor.

* * * * *